US012772588B2

(12) United States Patent
Park et al.

(10) Patent No.: US 12,772,588 B2
(45) Date of Patent: Oct. 20, 2026

(54) IMAGE SENSOR

(71) Applicant: SAMSUNG ELECTRONICS CO., LTD., Suwon-si (KR)

(72) Inventors: Miseon Park, Hwaseong-si (KR); Jaewoong Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1046 days.

(21) Appl. No.: 17/933,747

(22) Filed: Sep. 20, 2022

(65) Prior Publication Data

US 2023/0170370 A1 Jun. 1, 2023

(30) Foreign Application Priority Data

Nov. 29, 2021 (KR) ........................ 10-2021-0166805

(51) Int. Cl.
*H10F 39/00* (2025.01)
*H10F 39/18* (2025.01)

(52) U.S. Cl.
CPC ......... *H10F 39/807* (2025.01); *H10F 39/011* (2025.01); *H10F 39/182* (2025.01); *H10F 39/8053* (2025.01); *H10F 39/8063* (2025.01)

(58) Field of Classification Search
CPC .... H10F 39/807; H10F 39/812; H10F 39/813; H10F 39/011; H10F 39/182; H10F 39/8053; H10F 39/8063; H10F 39/014; H10F 39/199; H10F 39/8037
See application file for complete search history.

(56) References Cited

U.S. PATENT DOCUMENTS 8,749,679 B2 6/2014 Shinohara
9,240,345 B2 1/2016 Sung
9,466,629 B2 10/2016 Yoon et al.
9,564,463 B2 2/2017 Ihara
9,773,834 B2 9/2017 Feng et al.
10,062,720 B2 8/2018 Chiang et al.
(Continued)

FOREIGN PATENT DOCUMENTS

KR 10-2010-0025107 A 3/2010
KR 10-2015-0101681 A 9/2015
(Continued)

*Primary Examiner* — Jessica S Manno
*Assistant Examiner* — Ricky Verdes
(74) *Attorney, Agent, or Firm* — Morgan, Lewis & Bockius LLP

(57) ABSTRACT

An image sensor includes a substrate that includes a trench that defines pixel regions and a deep isolation pattern provided between the pixel regions and in the trench. The deep isolation pattern includes first and second insulating liner patterns disposed on first and second inner side surfaces of the trench, first and second lower insulating patterns disposed on lower inner side surfaces of the first and second insulating liner patterns and an isolation pattern provided between the first and second lower insulating patterns and that extends through the substrate. The deep isolation pattern further includes a first air gap region that is a space enclosed by the first insulating liner pattern, the first lower insulating pattern, and the isolation pattern, and a second air gap region that is a space between the second insulating liner pattern, the second lower insulating pattern, and the isolation pattern.

20 Claims, 23 Drawing Sheets

(56) References Cited

U.S. PATENT DOCUMENTS

| | | | | |
|---|---|---|---|---|
| 10,170,353 | B2 | 1/2019 | Zang et al. | |
| 10,979,621 | B2 | 4/2021 | Kim et al. | |
| 2007/0187734 | A1* | 8/2007 | Adkisson | H10F 39/807 257/E31.038 |
| 2015/0243694 | A1* | 8/2015 | Ihara | H10F 39/812 257/443 |
| 2016/0204156 | A1* | 7/2016 | Togashi | H10F 39/811 257/292 |
| 2020/0403014 | A1 | 12/2020 | Lee et al. | |
| 2021/0104560 | A1 | 4/2021 | Lee | |

FOREIGN PATENT DOCUMENTS

| | | | |
|---|---|---|---|
| KR | 10-2016-0045054 | A | 4/2016 |
| KR | 10-2021-0040654 | A | 4/2021 |
| KR | 10-2021-0081217 | A | 7/2021 |

* cited by examiner

IMAGE SENSOR

CROSS-REFERENCE TO RELATED APPLICATIONS

This U.S. non-provisional patent application claims priority under 35 U.S.C. § 119 from Korean Patent Application No. 10-2021-0166805, filed on Nov. 29, 2021 in the Korean Intellectual Property Office, the contents of which are herein incorporated by reference in their entirety.

TECHNICAL FIELD

Embodiments of the present disclosure are directed to an image sensor, and in particular, to a complementary metal-oxide semiconductor (CMOS) image sensor.

DISCUSSION OF THE RELATED ART

An image sensor is a semiconductor device that converts an optical image into electric signals. High-performance image sensors are used in a variety of applications, such as digital cameras, camcorders, personal communication systems, gaming machines, security cameras, micro-cameras for medical applications, and/or robots. Image sensors are typically classified into two types: a charge coupled device (CCD) type and a complementary metal-oxide-semiconductor (CMOS) type. In general, a CMOS-type image sensor is called “CIS”. A CIS device includes a plurality of two-dimensionally-arranged pixels. Each of the pixels includes a photodiode (PD) that coverts incident light into an electrical signal. The pixels are defined by a deep isolation pattern disposed therebetween.

SUMMARY

An embodiment of the inventive concept provides an image sensor with improved optical properties.

According to an embodiment of the inventive concept, an image sensor includes a substrate that includes a trench that defines a plurality of pixel regions and a deep isolation pattern provided between the pixel regions and in the trench. The deep isolation pattern includes a first insulating liner pattern disposed on a first inner side surface of the trench, a second insulating liner pattern disposed on a second inner side surface of the trench, a first lower insulating pattern disposed on a lower inner side surface of the first insulating liner pattern, a second lower insulating pattern disposed on a lower inner side surface of the second insulating liner pattern, and an isolation pattern provided between the first and second lower insulating patterns and that extends through the substrate. The deep isolation pattern further includes a first air gap region that is a space enclosed by the first insulating liner pattern, the first lower insulating pattern, and the isolation pattern, and a second air gap region that is a space between the second insulating liner pattern, the second lower insulating pattern, and the isolation pattern.

According to an embodiment of the inventive concept, an image sensor includes a substrate that includes a plurality of pixel regions, a trench that defines the pixel regions, and a deep isolation pattern provided between the pixel regions and in the trench. The deep isolation pattern includes a first insulating liner pattern disposed on a first inner side surface of the trench, a second insulating liner pattern disposed on a second inner side surface of the trench, a first lower insulating pattern disposed on a lower inner side surface of the first insulating liner pattern, a second lower insulating pattern disposed on a lower inner side surface of the second insulating liner pattern, and a semiconductor liner pattern provided between the first and second lower insulating patterns and spaced apart from the first and second insulating liner patterns. The deep isolation pattern further includes a first air gap region that is a space between the first insulating liner pattern and the semiconductor liner pattern, and a second air gap region that is a space between the second insulating liner pattern and the semiconductor liner pattern.

According to an embodiment of the inventive concept, an image sensor includes a substrate that includes a first surface and a second surface that are opposite to each other, a plurality of pixel regions, a first trench that is recessed from the first surface of the substrate, and a second trench that defines the plurality of pixel regions, a shallow isolation pattern disposed in the first trench, a deep isolation pattern provided between the pixel regions and in the second trench, a transistor disposed on the first surface of the substrate, a micro lens disposed on the second surface of the substrate, and color filters interposed between the substrate and the micro lens and disposed on the pixel regions, respectively. The deep isolation pattern includes a first insulating liner pattern disposed on a first inner side surface of the second trench, a second insulating liner pattern disposed on a second inner side surface of the second trench, a first lower insulating pattern disposed on a lower inner side surface of the first insulating liner pattern, a second lower insulating pattern disposed on a lower inner side surface of the second insulating liner pattern, and a semiconductor liner pattern provided between the first and second lower insulating patterns and spaced apart from the first and second insulating liner patterns. The deep isolation pattern further includes a first air gap region that is a space between the first insulating liner pattern and the semiconductor liner pattern, and a second air gap region that is a space between the second insulating liner pattern and the semiconductor liner pattern.

DETAILED DESCRIPTION

Exemplary embodiments of the inventive concepts will now be described more fully with reference to the accompanying drawings, in which exemplary embodiments are shown.

Figure 1:
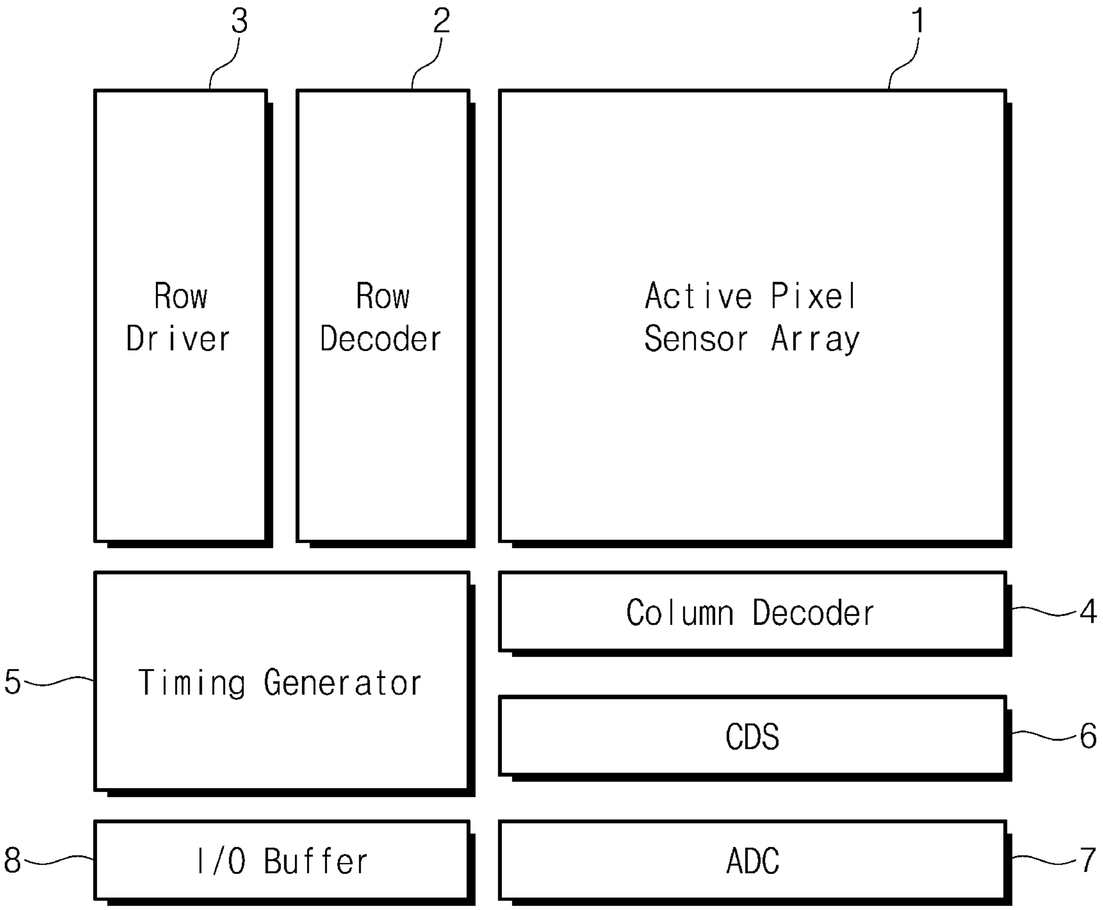
FIG. 1 is a block diagram of an image sensor according to an embodiment of the inventive concept.

FIG. 1 is a block diagram of an image sensor according to an embodiment of the inventive concept.

Referring to FIG. 1, in an embodiment, an image sensor includes an active pixel sensor array 1, a row decoder (a decoder circuit) 2, a row driver (a driver circuit) 3, a column decoder (a decoder circuit) 4, a timing generator (a timing circuit) 5, a correlated double sampler (CDS) (a sampling circuit) 6, an analog-to-digital converter (ADC) (a convertor circuit) 7, and an input/output (I/O) buffer (a buffer circuit) 8.

The active pixel sensor array 1 includes a plurality of pixels, which are two-dimensionally arranged and are used to convert optical signals into electrical signals. The active pixel sensor array 1 is driven by a plurality of driving signals, such as pixel selection signals, reset signals, and charge transfer signals, received from the row driver 3. In addition, the electrical signals that are converted by the active pixel sensor array 1 are transmitted to the CDS 6.

The row driver 3 provides a plurality of driving signals that are used to drive the pixels to the active pixel sensor array 1, based on results decoded by the row decoder 2. When the pixels are arranged in a matrix pattern, the driving signals are transmitted to respective rows of the pixels.

The timing generator 5 provides a timing signal and a control signal to the row decoder 2 and the column decoder 4.

The CDS 6 receives the electric signals generated by the active pixel sensor array 1 and performs a holding and sampling operation on the received electric signals. In addition, the CDS 6 performs a double sampling operation on a specific noise level and a signal level of the electric signal and outputs a difference level that corresponds to a difference between the noise and signal levels.

The ADC 7 converts an analog signal that contains information on the difference level outputted from the CDS 6 into a digital signal and outputs the converted digital signal.

The I/O buffer 8 latches the digital signals and sequentially outputs the latched digital signals to an image signal processing unit, based on the result decoded by the column decoder 4.

Figure 2:
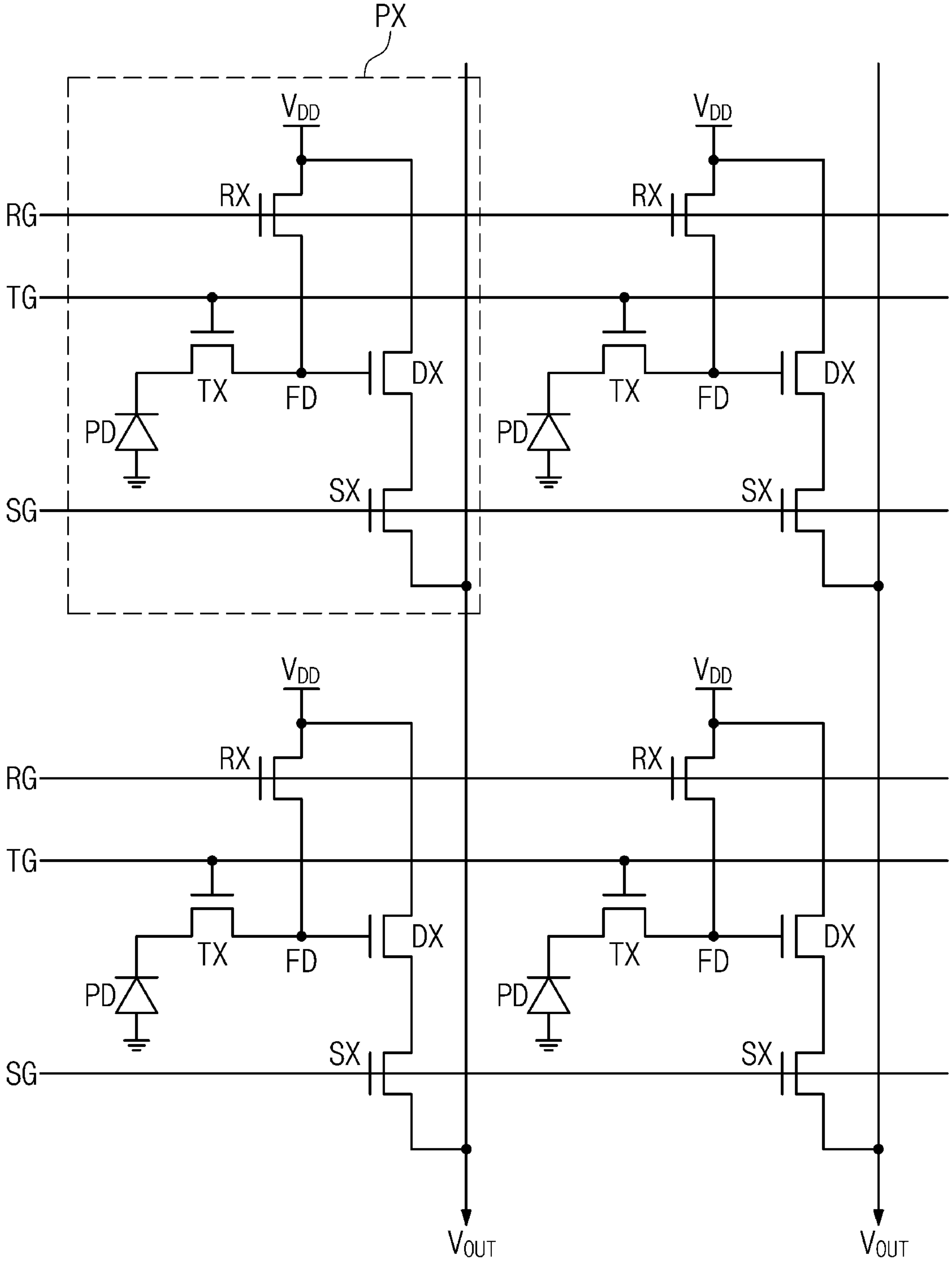
FIG. 2 is a circuit diagram of an active pixel sensor array of an image sensor according to an embodiment of the inventive concept.

FIG. 2 is a circuit diagram of an active pixel sensor array of an image sensor according to an embodiment of the inventive concept.

Referring to FIGS. 1 and 2, in an embodiment, the active pixel sensor array 1 includes a plurality of pixel regions PX, and the pixel regions PX are arranged in a matrix pattern. Each of the pixel regions PX includes a transfer transistor TX and logic transistors RX, SX, and DX. The logic transistors include a reset transistor RX, a selection transistor SX, and a drive transistor DX. The transfer transistor TX, the reset transistor RX, and the selection transistor SX include a transfer gate TG, a reset gate RG, and a selection gate SG, respectively. Each of the pixel regions PX further includes a photoelectric conversion device PD and a floating diffusion region FD.

The photoelectric conversion device PD generates and holds photocharges whose amount is proportional to an amount of incident light. The photoelectric conversion device PD is a photodiode that includes a p-type impurity region and an n-type impurity region. The transfer transistor TX transfers electric charges that are generated in the photoelectric conversion device PD to the floating diffusion region FD. The floating diffusion region FD receives the charges that are generated by the photoelectric conversion device PD and cumulatively stores them therein. The drive transistor DX is controlled by an amount of the photocharges that are stored in the floating diffusion region FD.

The reset transistor RX periodically discharges the electric charges stored in the floating diffusion region FD. A drain electrode of the reset transistor RX is connected to the floating diffusion region FD, and a source electrode of the reset transistor RX is connected to a power voltage VDD. If the reset transistor RX is turned on, the power voltage VDD is transmitted to the floating diffusion region FD. Thus, when the reset transistor RX is turned on, the electric charges stored in the floating diffusion region FD are discharged, and the floating diffusion region FD is reset.

The drive transistor DX is a source follower buffer amplifier. The drive transistor DX amplifies a variation in electric potential of the floating diffusion region FD and outputs the amplified signal to an output line Vout.

The selection transistor SX selects a row of the pixel regions PX that will be read out during a read operation. When the selection transistor SX is turned on, the power voltage VDD is transmitted to a drain electrode of the drive transistor DX.

FIG. 2 illustrates the unit pixel region PX that includes one photoelectric conversion device PD and four transistors TX, RX, DX, and SX, but embodiments of the inventive concept are not necessarily limited to this structure of the image sensor. For example, in an embodiment, one or more of the reset transistor RX, the drive transistor DX, or the selection transistor SX are shared adjacent pixel regions PX, which increases an integration density of the image sensor.

Figure 3:
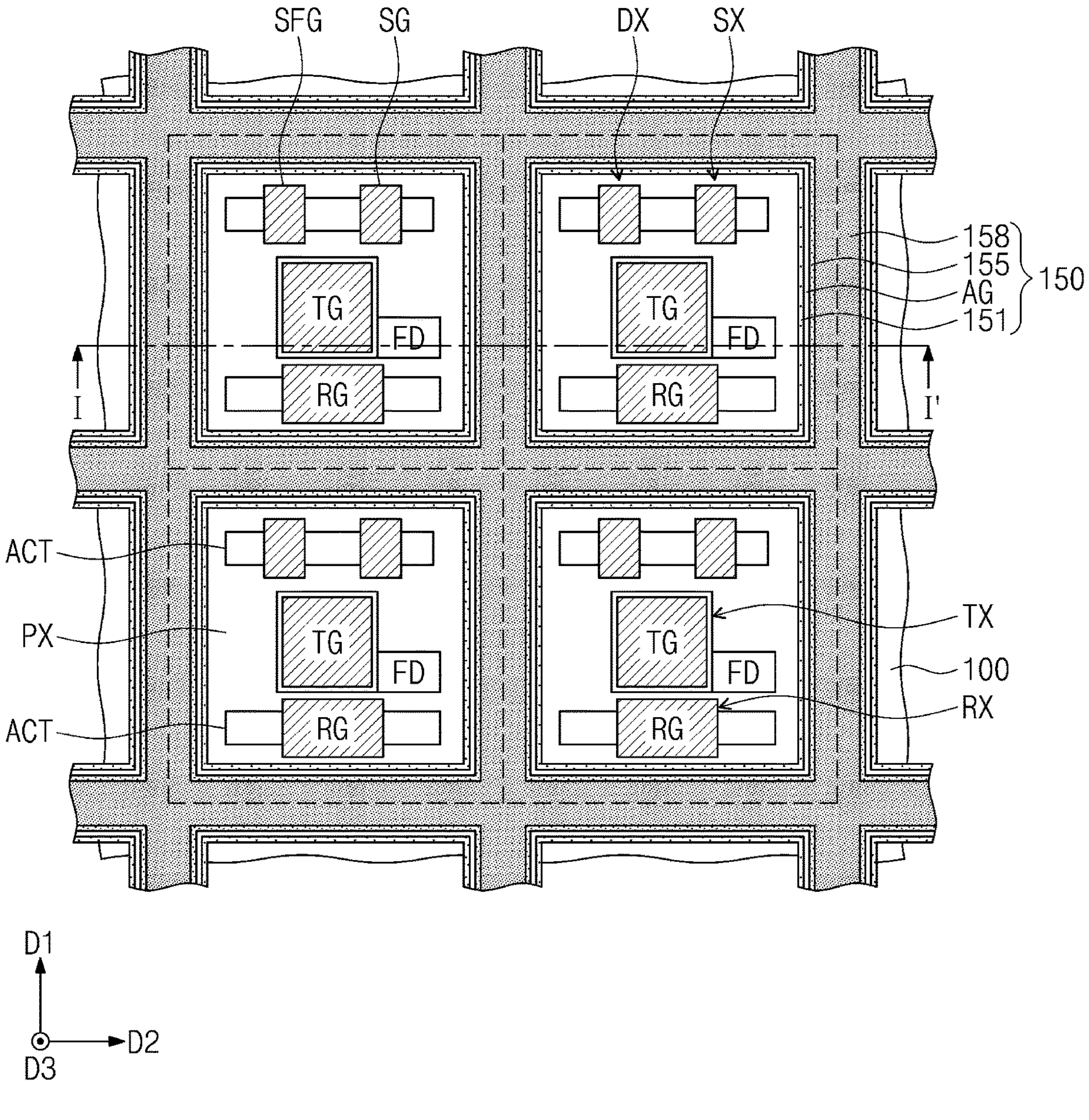
FIG. 3 is a plan view of an image sensor according to an embodiment of the inventive concept.
Figure 4:
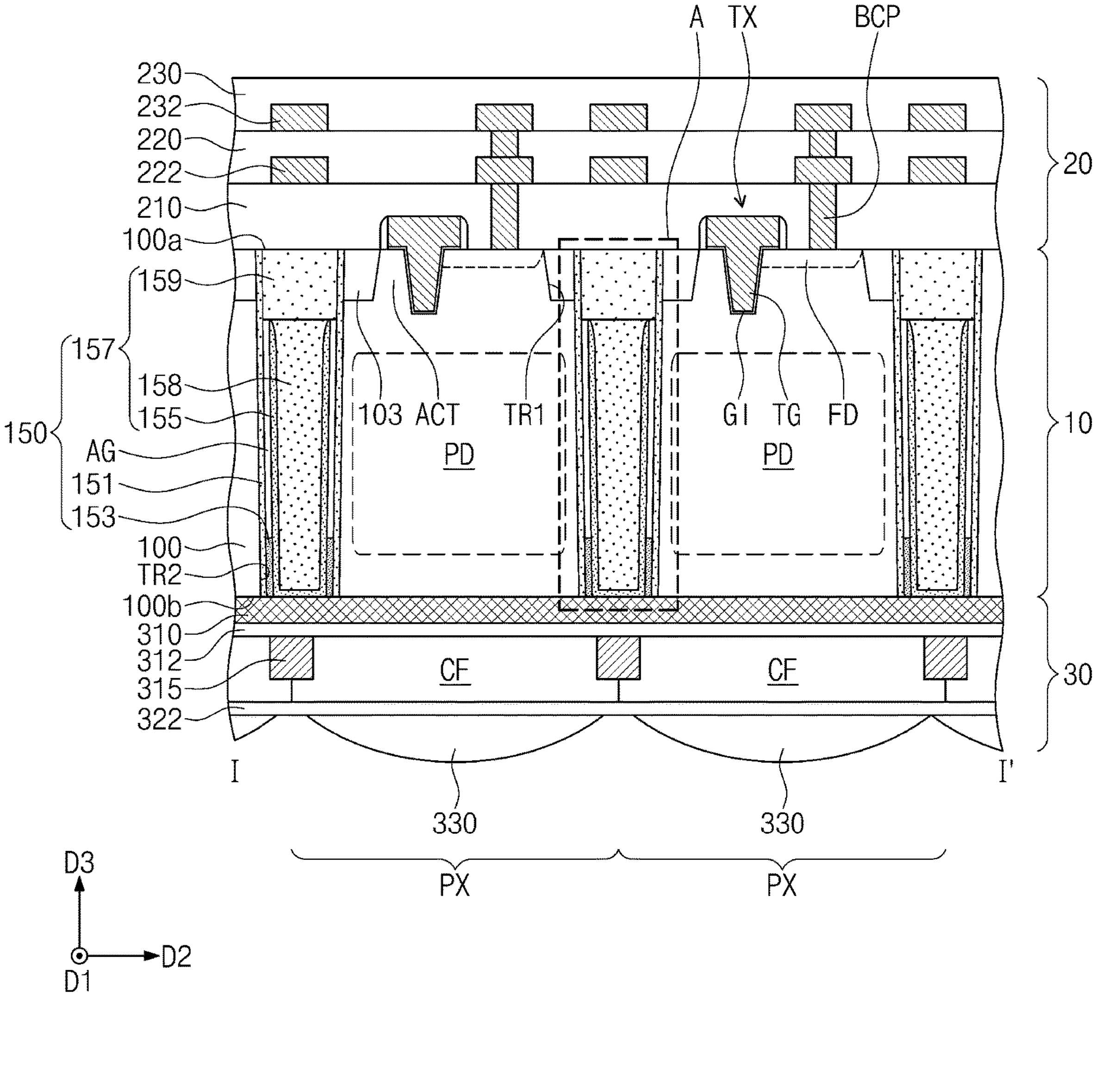
FIG. 4 is a sectional view taken along a line I-I' of FIG. 3 of an image sensor according to an embodiment of the inventive concept.
Figure 5:
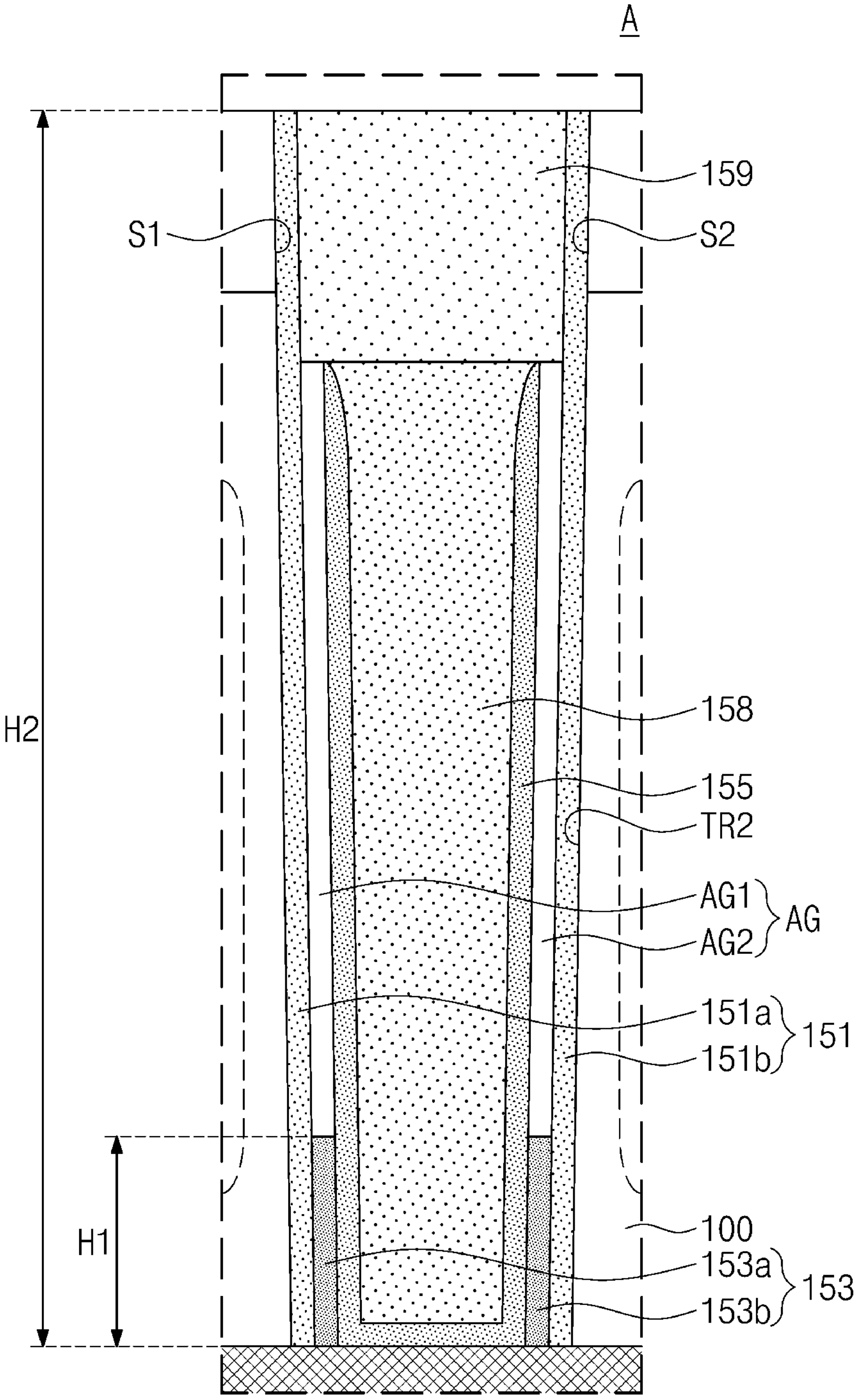
FIG. 5 is an enlarged sectional view of a portion ‘A’ of FIG. 4.

FIG. 3 is a plan view of an image sensor according to an embodiment of the inventive concept. FIG. 4 is a sectional view taken along a line I-I' of FIG. 3 of an image sensor according to an embodiment of the inventive concept. FIG. 5 is an enlarged sectional view of a portion 'A' of FIG. 4.

Referring to FIGS. 3 and 4, an image sensor according to an embodiment of the inventive concept includes a photoelectric conversion layer 10, an interconnection layer 20, and an optically-transparent layer 30. The photoelectric conversion layer 10 is disposed between the interconnection layer 20 and the optically-transparent layer 30.

The photoelectric conversion layer 10 includes a substrate 100. The substrate 100 may be a semiconductor substrate, such as a silicon wafer, a germanium wafer, a silicon-germanium wafer, a II-VI compound semiconductor wafer, or a III-V compound semiconductor wafer, or a silicon-oninsulator (SOI) wafer. The substrate 100 includes a first surface 100*a* and a second surface 100*b* that are opposite to each other in a third or thickness direction D3. For example, the first surface 100*a* of the substrate 100 is a front surface, and the second surface 100*b* is a rear surface. Light is incident into the substrate 100 through the second surface 100*b*.

The substrate 100 includes pixel regions PX. When viewed in a plan view, the pixel regions PX are two-dimensionally arranged in plane defined by a first direction D1 and a second direction D2 that are parallel to the second surface 100*b* of the substrate 100. The first and second directions D1 and D2 are not parallel to each other. The third direction D3 is normal to the plane defined by the first direction D1 and the second direction D2. The substrate 100 includes a plurality of photoelectric conversion regions PD therein. The photoelectric conversion regions PD are located between the first and second surfaces 100*a* and 100*b* of the substrate 100. The photoelectric conversion regions PD are respectively provided in the pixel regions PX of the substrate 100. In the present specification, the photoelectric conversion region PD refer to a region in which the photoelectric conversion device PD of FIGS. 1 and 2 is disposed.

The substrate 100 is doped to have a first conductivity type, and the photoelectric conversion region PD is doped to have a second conductivity type that differs from the first conductivity type. For example, the first conductivity type is a p-type, and the second conductivity type is an n-type. Impurities for the first conductivity type include at least one of aluminum, boron, indium, or gallium. Impurities for the second conductivity type include at least one of phosphorus, arsenic, bismuth, or antimony. The photoelectric conversion region PD and the substrate 100 form a pn junction that serves as a photodiode.

The photoelectric conversion layer 10 includes a shallow isolation pattern 103. The shallow isolation pattern 103 is disposed adjacent to the first surface 100*a* of the substrate 100. Each of the pixel regions PX includes active regions ACT defined by the shallow isolation pattern 103. The shallow isolation pattern 103 are disposed in a first trench TR1 that is recessed from the first surface 100*a* of the substrate 100. The shallow isolation pattern 103 is formed of or includes at least one of, for example, silicon oxide, silicon nitride, or silicon oxynitride.

The photoelectric conversion layer 10 includes a deep isolation pattern 150. The deep isolation pattern 150 is disposed in the substrate 100 between the pixel regions PX. The deep isolation pattern 150 penetrates at least a portion of the substrate 100. For example, the deep isolation pattern 150 penetrates the shallow isolation pattern 103 and extends into the substrate 100. The deep isolation pattern 150 is disposed in a second trench TR2. The second trench TR2 is contained within and surrounded by the first trench TR1. The second trench TR2 defines the pixel regions PX. The second trench TR2 penetrates the shallow isolation pattern 103 and extends toward the second surface 100*b* of the substrate 100. A width of an upper portion of the second trench TR2 is narrower than a width of a bottom surface of the first trench TR1. In the present specification, a width of an element means a length of the element measured in a direction, such as the second direction D2, that is parallel to the second surface 100*b* of the substrate 100. When viewed in a plan view, the deep isolation pattern 150 encloses each of the pixel regions PX or has a lattice structure. In an embodiment, the deep isolation pattern 150 extends from the first surface 100*a* of the substrate 100 toward the second surface 100*b* of the substrate 100, and a bottom surface of the deep isolation pattern 150 is substantially coplanar with the second surface 100*b* of the substrate 100. The deep isolation pattern 150 is formed of or includes an insulating material whose refractive index is lower than that of the substrate 100.

Referring to FIGS. 3, 4, and 5, in an embodiment, the deep isolation pattern 150 includes an insulating liner pattern 151, a lower insulating pattern 153, and an isolation pattern 157. The deep isolation pattern 150 includes an air gap region AG. In an embodiment, the isolation pattern 157 includes a semiconductor liner pattern 155, a semiconductor gap-fill pattern 158, and a capping insulating pattern 159.

The insulating liner pattern 151 fills a portion of the second trench TR2. The insulating liner pattern 151 conformally covers inner side surfaces of the second trench TR2. The insulating liner pattern 151 is interposed between the shallow isolation pattern 103 and the capping insulating pattern 159 and includes a portion that extends into the substrate 100 and is interposed between the substrate 100 and the lower insulating pattern 153. The insulating liner pattern 151 exposes a bottom surface of the second trench TR2. The insulating liner pattern 151 is formed of or includes at least one of an oxide material, such as silicon oxide, silicon oxynitride, or a high-k dielectric material, such as hafnium oxide or aluminum oxide.

The lower insulating pattern 153 fills a portion of the second trench TR2. The lower insulating pattern 153 conformally covers lower inner side surfaces of the insulating liner pattern 151. The lower insulating pattern 153 is interposed between the insulating liner pattern 151 and the semiconductor liner pattern 155. The lower insulating pattern 153 exposes the bottom surface of the second trench TR2. The lower insulating pattern 153 exposes upper inner side surfaces of the insulating liner pattern 151. A top surface of the lower insulating pattern 153 is located at a lower level than the uppermost surface of the semiconductor liner pattern 155. In the present specification, a term "level" means a height in the third direction D3 from the second surface 100*b* of the substrate 100. The lower insulating pattern 153 is formed of or includes a material that differs from that of the insulating liner pattern 151. The lower insulating pattern 153 is formed of or includes at least one nitride material, such as silicon nitride, silicon carbonitride, silicon oxycarbonitride, or silicon oxynitride. A height H1 of the lower insulating pattern 153 is from 5% to 20% of a height H2 of the deep isolation pattern 150. In the present specification, a term "height" means a distance measured in a direction, such as the third direction D3, that is perpendicular to the second surface 100*b* of the substrate 100.

The isolation pattern 157 penetrates the substrate 100. The semiconductor liner pattern 155 fills a portion of the second trench TR2. The semiconductor liner pattern 155 covers the bottom surface of the second trench TR2 and conformally covers inner side surfaces of the lower insulating pattern 153. The semiconductor liner pattern 155 is disposed on a bottom surface of the capping insulating pattern 159. The semiconductor liner pattern 155 has a cup-like shape that surrounds a space. The semiconductor liner pattern 155 extends from the bottom surface of the second trench TR2 into the substrate 100 and is in contact with the bottom surface of the capping insulating pattern 159. The semiconductor liner pattern 155 is not in contact with the insulating liner pattern 151 and is spaced apart from the insulating liner pattern 151. An upper portion of the semiconductor liner pattern 155 has a width that decreases in a direction toward the first surface 100*a* of the substrate 100. In an embodiment, the upper portion of the semiconductor liner pattern 155 has a sharp or pointed shape. The semiconductor liner pattern 155 is formed of or includes poly silicon. For example, the semiconductor liner pattern 155 is formed of or includes impurity-doped poly silicon. The semiconductor liner pattern 155 includes poly silicon that is doped with n- or p-type impurities. The semiconductor liner pattern 155 may contain p-type impurities, such as boron.

The semiconductor gap-fill pattern 158 fills a portion of the second trench TR2. The semiconductor gap-fill pattern 158 covers an inner surface and inner side surfaces of the semiconductor liner pattern 155. The semiconductor gap-fill pattern 158 fills the space surrounded by the cup-shaped semiconductor liner pattern 155. A top surface of the semiconductor gap-fill pattern 158 is coplanar with the uppermost surface of the semiconductor liner pattern 155. The semiconductor gap-fill pattern 158 is formed of or includes poly silicon. In an embodiment, the semiconductor gap-fill pattern 158 does not contain an impurity. For example, the semiconductor gap-fill pattern 158 is formed of or includes undoped poly silicon. The term "undoped" means that a doping process is intentionally omitted.

The capping insulating pattern 159 is provided on the air gap region AG, the semiconductor liner pattern 155, and the semiconductor gap-fill pattern 158. The capping insulating pattern 159 fills a remaining portion of the second trench TR2, excluding the air gap region AG. The capping insulating pattern 159 covers upper inner side surfaces of the insulating liner pattern 151. A width of the capping insulating pattern 159 is greater than a width of the semiconductor gap-fill pattern 158. The capping insulating pattern 159 is formed of or includes at least one of an oxide material, such as silicon oxide, silicon oxynitride, or a high-k dielectric material, such as hafnium oxide or aluminum oxide.

The air gap region AG is a space between the insulating liner pattern 151 and the semiconductor liner pattern 155 and between the lower insulating pattern 153 and the capping insulating pattern 159. The air gap region AG is enclosed by the insulating liner pattern 151, the lower insulating pattern 153, the semiconductor liner pattern 155, and the capping insulating pattern 159.

Hereinafter, the deep isolation pattern 150 will be described in more detail with reference to FIG. 5. The insulating liner pattern 151 includes a first insulating liner pattern 151*a* and a second insulating liner pattern 151*b*. The first insulating liner pattern 151*a* is disposed on a first inner side surface S1 of the second trench TR2. The second insulating liner pattern 151*b* is disposed on a second inner side surface S2 of the second trench TR2. The lower insulating pattern 153 includes a first lower insulating pattern 153*a* and a second lower insulating pattern 153*b*. The first lower insulating pattern 153*a* is disposed on a lower inner side surface of the first insulating liner pattern 151*a*. The first lower insulating pattern 153*a* exposes an upper inner side surface of the first insulating liner pattern 151*a*. The second lower insulating pattern 153*b* is disposed on a lower inner side surface of the second insulating liner pattern 151*b*. The second lower insulating pattern 153*b* exposes an upper inner side surface of the second insulating liner pattern 151*b*. The height H1 of the first lower insulating pattern 153*a* is from 5% to 20% of the height H2 of the deep isolation pattern 150. A height H1 of the second lower insulating pattern 153*b* is from 5% to 20% of the height H2 of the deep isolation pattern 150. A top surface of the first lower insulating pattern 153*a* is located at a lower level than a top surface of the first insulating liner pattern 151*a* and the uppermost surface of the semiconductor liner pattern 155. A top surface of the second lower insulating pattern 153*b* is located at a lower level than a top surface of the second insulating liner pattern 151*b* and the uppermost surface of the semiconductor liner pattern 155.

The isolation pattern 157 is provided between the first lower insulating pattern 153*a* and the second lower insulating pattern 153*b* and extends through the substrate 100. The semiconductor liner pattern 155 covers the bottom surface of the second trench TR2, an inner side surface of the first lower insulating pattern 153*a*, and an inner side surface of the second lower insulating pattern 153*b* and extends through the substrate 100. The air gap region AG includes a first air gap region AG1 and a second air gap region AG2. The first air gap region AG1 is a space that is enclosed by the first insulating liner pattern 151*a*, the first lower insulating pattern 153*a*, and the isolation pattern 157. The first air gap region AG1 is a space between the first insulating liner pattern 151*a* and the semiconductor liner pattern 155 and between the first lower insulating pattern 153*a* and the capping insulating pattern 159. The second air gap region AG2 is a space that is enclosed by the second insulating liner pattern 151*b*, the second lower insulating pattern 153*b*, and the isolation pattern 157. The second air gap region AG2 is a space between the second insulating liner pattern 151*b* and the semiconductor liner pattern 155 and between the second lower insulating pattern 153*b* and the capping insulating pattern 159. In an embodiment, each of the first air gap region AG1 and the second air gap region AG2 contains air.

According to an embodiment of the inventive concept, due to the air gap region AG, optical sensitivity loss of the image sensor can be minimized. In addition, by adjusting a ratio between heights of the air gap region AG and the lower insulating pattern 153, reflectance of the deep isolation pattern 150 can be controlled, and thus, an image sensor has increased optical properties.

Referring back to FIGS. 3 and 4, the transfer transistors TX and the logic transistors RX, SX, and DX are disposed on the first surface 100*a* of the substrate 100. Each of the transistors TX, RX, SX, and DX is disposed on a corresponding active region ACT of each pixel region PX. The transfer transistor TX includes the transfer gate TG on a corresponding active region ACT and floating diffusion region FD. The transfer gate TG includes a lower portion that is partially inserted into the substrate 100, and an upper portion that is disposed on the first surface 100*a* of the substrate 100 and protrudes upward from the first surface 100*a*. A gate dielectric layer GI is interposed between the transfer gate TG and the substrate 100. The floating diffusion region FD is provided in a portion of the corresponding active region ACT that is located at a side of the transfer gate TG. The floating diffusion region FD is doped to have the second conductivity type, such as an n-type, that differs from the first conductivity type of the substrate 100.

The drive transistor DX includes a drive gate SFG provided on a corresponding active region ACT, and the selection transistor SX includes the selection gate SG provided on a corresponding active region ACT. The reset transistor RX includes the reset gate RG provided on a corresponding active region ACT. An additional gate dielectric layer GI is interposed between each of the drive, selection, and reset gates SFG, SG, and RG and the substrate 100.

The interconnection layer 20 is disposed on the first surface 100*a* of the substrate 100. The interconnection layer 20 includes a first interlayer insulating layer 210, a second interlayer insulating layer 220, and a third interlayer insulating layer 230 that are sequentially stacked on the first surface 100*a* of the substrate 100. The interconnection layer 20 further includes contact plugs BCP in the first interlayer insulating layer 210, first interconnection patterns 222 in the second interlayer insulating layer 220, and second interconnection patterns 232 in the third interlayer insulating layer 230. The first interlayer insulating layer 210 is disposed on the first surface 100*a* of the substrate 100 and covers the transistors TX, RX, SX, and DX, and the contact plugs BCP are connected to terminals of the transistors TX, RX, SX, and DX. The contact plugs BCP are connected to corresponding first interconnection patterns 222, and the first interconnection patterns 222 are connected to corresponding second interconnection patterns 232. The first and second interconnection patterns 222 and 232 are electrically connected to the transistors TX, RX, SX, and DX through the contact plugs BCP. Each of the first to third interlayer insulating layers 210, 220, and 230 is formed of or includes an insulating material, and the contact plugs BCP, the first interconnection patterns 222, and the second interconnection patterns 232 are formed of or include conductive materials.

The optically-transparent layer 30 is disposed on the second surface 100*b* of the substrate 100. The optically-transparent layer 30 includes a plurality of color filters CF and a plurality of micro lenses 330. The optically-transparent layer 30 condenses and filters externally incident light and provides the light into the photoelectric conversion layer 10.

The micro lenses 330 are provided on the second surface 100*b* of the substrate 100. Each of the micro lenses 330 vertically overlaps the photoelectric conversion region PD of a corresponding pixel region PX, e.g., in the third direction D3. The micro lenses 330 have a convex shape that is curved away from the second surface 100*b*, and effectively condense light incident into the pixel regions PX.

The color filters CF are disposed between the second surface 100*b* of the substrate 100 and the micro lenses 330. Each of the color filters CF vertically overlaps the photoelectric conversion region PD of a corresponding pixel region PX. Each of the color filters CF is one of a red, green, or blue filter, and here, the color of the color filter CF is determined based on a position of an underlying unit pixel. However, embodiments are not necessarily limited thereto, and in an embodiment, each of the color filters CF is one of a yellow, magenta, or cyan filter. The color filters CF are two-dimensionally arranged.

An anti-reflection layer 310 is disposed on the second surface 100*b* of the substrate 100. The anti-reflection layer 310 is interposed between the second surface 100*b* of the substrate 100 and the color filters CF. The anti-reflection layer 310 conformally covers the second surface 100*b* of the substrate 100. The anti-reflection layer 310 prevents light that is incident into the second surface 100*b* of the substrate 100 from being reflected and allows the light to effectively reach the photoelectric conversion region PD. The anti-reflection layer 310 is formed of or includes at least one of silicon oxide, silicon nitride, silicon oxynitride, or a high-k dielectric material, such as hafnium oxide or aluminum oxide.

A first passivation layer 312 is interposed between the anti-reflection layer 310 and the color filters CF. A second passivation layer 322 is interposed between the color filters CF and the micro lenses 330. The first passivation layer 312 conformally covers the anti-reflection layer 310. In an embodiment, the first passivation layer 312 is formed of or includes at least one of a metal oxide material or a nitride material. For example, the metal oxide material is formed of or includes aluminum oxide, and the nitride material is formed of or includes silicon nitride.

A grid pattern 315 is disposed between the pixel regions PX. The grid pattern 315 is interposed between the first passivation layer 312 and the color filters CF. The grid pattern 315 vertically overlaps the deep isolation pattern 150. When viewed in a plan view, the grid pattern 315 has a lattice shape. The grid pattern 315 guides light propagating toward the second surface 100*b* of the substrate 100 such that the light is incident into the photoelectric conversion region PD. The grid pattern 315 is formed of or includes at least one of a metal or a low refractive index (LRI) material. The metal includes at least one of tungsten or titanium. The LRI materials have refractive indices that are lower than those of silicon oxide and the color filters CF.

FIGS. 6 to 11 are sectional views that illustrate a method of fabricating an image sensor according to an embodiment of the inventive concept and that correspond to the line I-F of FIG. 3. For the sake of brevity, image sensor elements previously described with reference to FIGS. 1 to 5 may be identified by the same reference number without a repeated description thereof.

Figure 6:
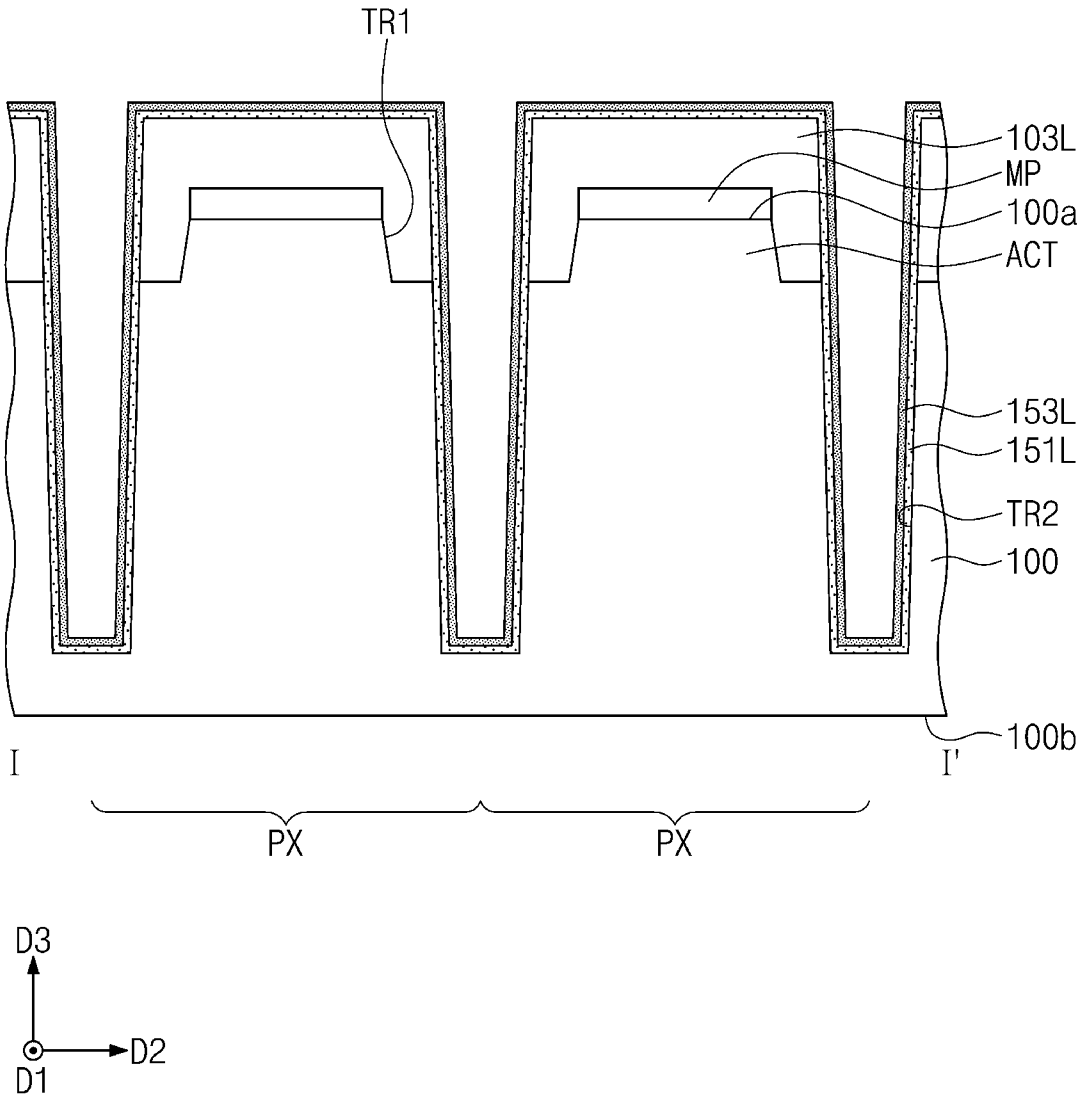
FIGS. 6 to 11 are sectional views that illustrate a method of fabricating an image sensor according to an embodiment of the inventive concept and that correspond to the line I-I' of FIG. 3.

Referring to FIGS. 3 and 6, in an embodiment, the substrate 100 is provided. The substrate 100 includes opposite first and second surfaces 100*a* and 100*b*. The first trench TR1 is formed into the substrate 100 from the first surface 100*a* of the substrate 100. The formation of the first trench TR1 includes forming a first mask pattern MP on the first surface 100*a* of the substrate 100 and etching the substrate 100 using the first mask pattern MP as an etch mask. The first trench TR1 defines the active regions ACT in the substrate 100.

A device isolation layer 103L is formed on the first surface 100*a* of the substrate 100. The device isolation layer 103L fills the first trench TR1 and covers the first mask pattern MP. The device isolation layer 103L is formed of or includes at least one of, for example, silicon oxide, silicon nitride, or silicon oxynitride.

The second trench TR2 is formed in the substrate 100. The formation of the second trench TR2 includes forming a second mask pattern that defines a position and shape of the second trench TR2 on the device isolation layer 103L, and etching the device isolation layer 103L and the substrate 100 using the second mask pattern as an etch mask. The bottom surface of the second trench TR2 is located at a higher level than the second surface 100*b* of the substrate 100. The pixel regions PX is defined in the substrate 100 by the second trench TR2. The pixel regions PX include the active regions ACT that are defined by the first trench TR1.

A first insulating layer 151L is formed on the substrate 100. The first insulating layer 151L conformally covers the inner side surfaces and the bottom surface of the second trench TR2. The first insulating layer 151L extends to cover the device isolation layer 103L. The first insulating layer 151L is formed of or includes at least one of an oxide material, such as silicon oxide, silicon oxynitride, or a high-k dielectric material, such as hafnium oxide or aluminum oxide.

A second insulating layer 153L is formed on the substrate 100. The second insulating layer 153L fills a portion of the second trench TR2. The second insulating layer 153L conformally covers the first insulating layer 151L. The second insulating layer 153L is formed of or includes at least one nitride material, such as silicon nitride, silicon carbonitride, silicon oxycarbonitride, or silicon oxynitride. The second insulating layer 153L is formed by one of an atomic layer deposition (ALD) process or a low-pressure chemical vapor deposition (LPCVD) process. In an embodiment, the atomic layer deposition (ALD) process is performed at a temperature between 600° C. and 780° C., and the low-pressure chemical vapor deposition (LPCVD) process is performed at a temperature between 450° C. and 650° C.

Figure 7:
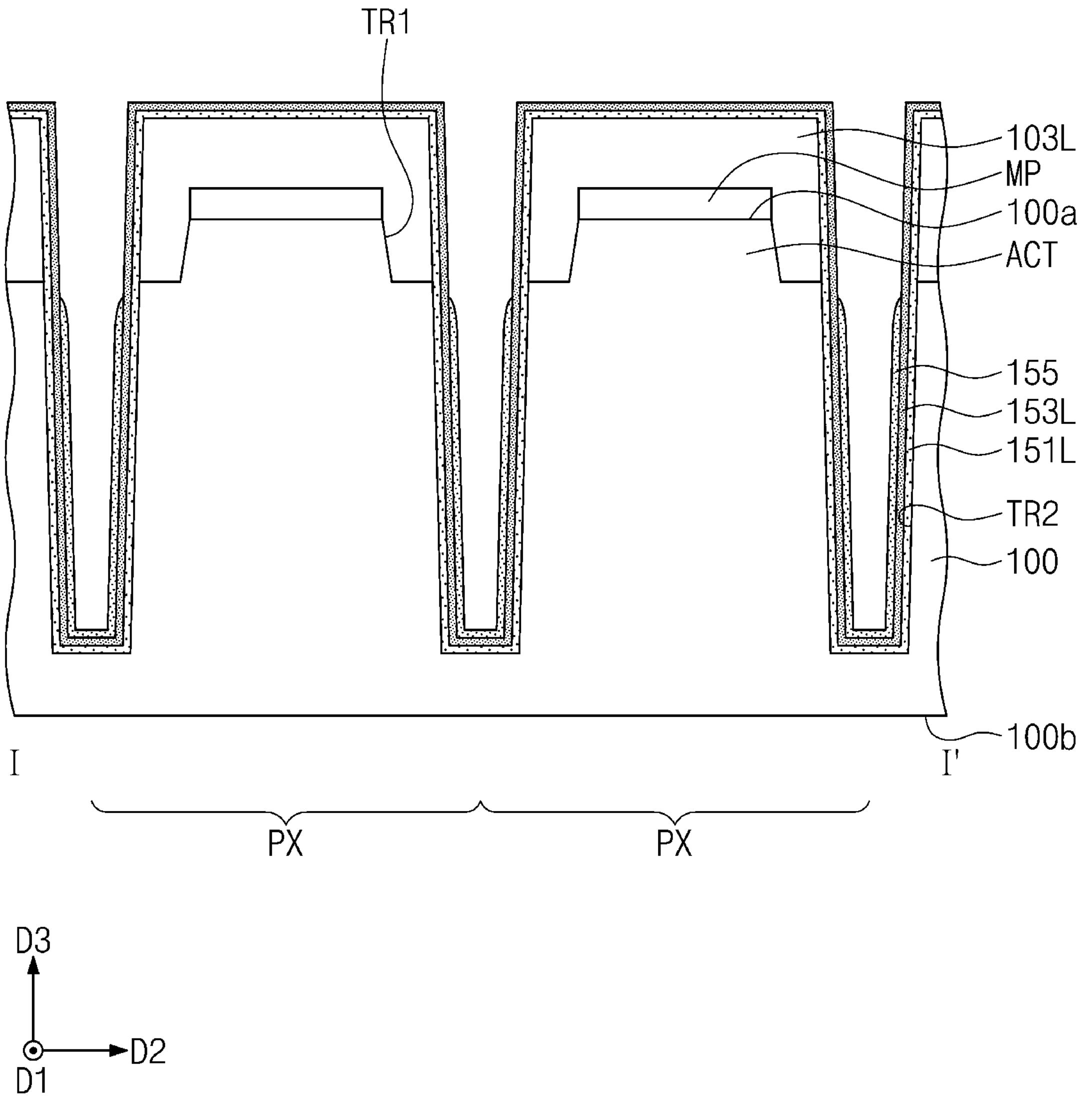

Referring to FIGS. 3 and 7, in an embodiment, the semiconductor liner pattern 155 is formed and fills a portion of the second trench TR2. In an embodiment, the formation of the semiconductor liner pattern 155 includes forming a preliminary semiconductor layer on the second insulating layer 153L that fills a portion of the second trench TR2 and anisotropically etching the preliminary semiconductor layer. In an embodiment, the preliminary semiconductor layer is formed by a low-pressure chemical vapor deposition (LPCVD) process. In an embodiment, the LPCVD process is performed at a temperature between 300° C. and 530° C. The anisotropic etching process removes the preliminary semiconductor layer from an upper region of the second trench TR2 and exposes the second insulating layer 153L. The semiconductor liner pattern 155 is locally formed in a lower region of the second trench TR2. The formation of the semiconductor liner pattern 155 further includes injecting first conductivity type, such as p-type, impurities into the semiconductor liner pattern 155. In an embodiment, after forming the semiconductor liner pattern 155, a cleaning process is further performed to remove an etch residue of the anisotropic etching process.

Figure 8:
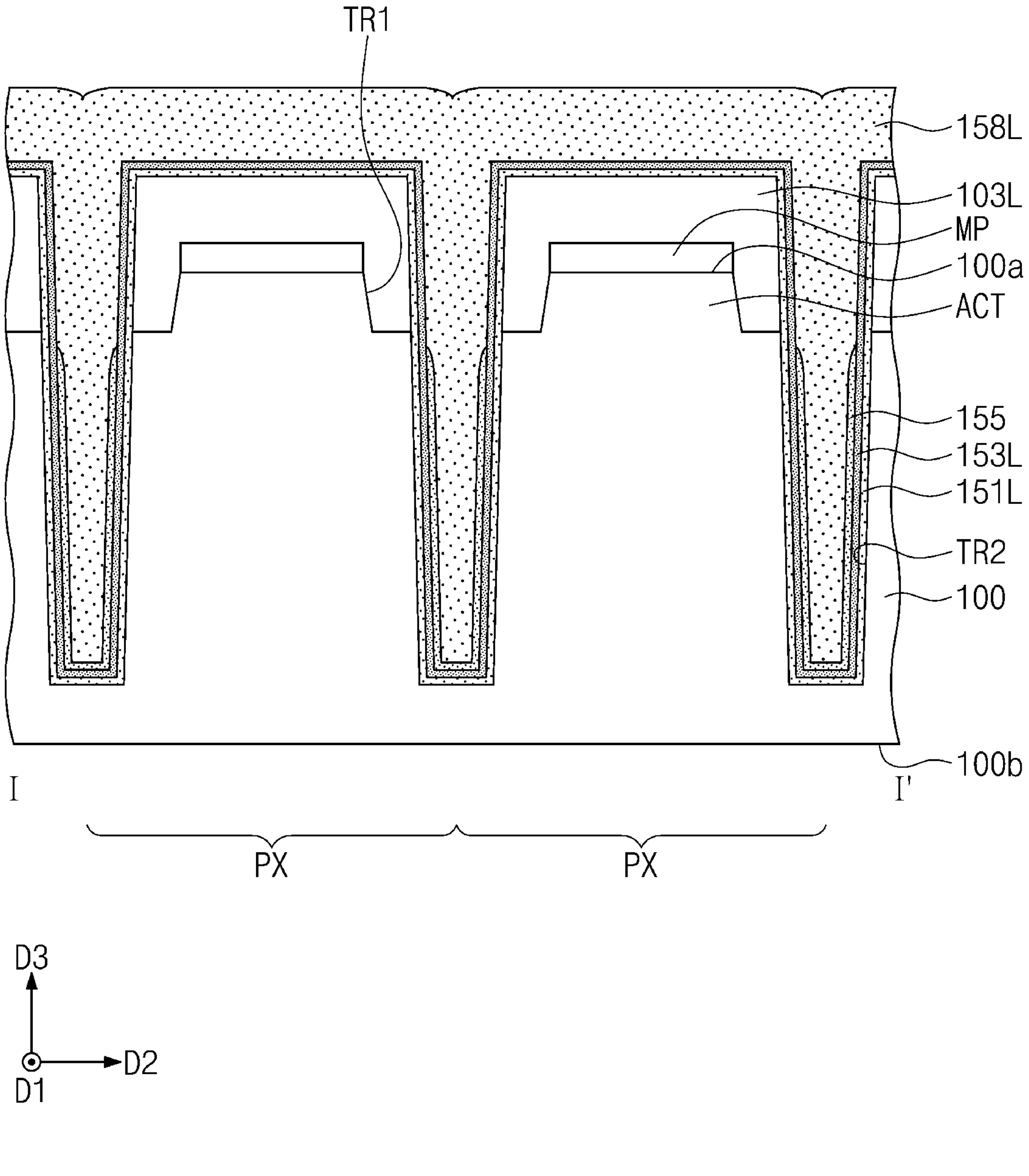

Referring to FIGS. 3 and 8, in an embodiment, a semiconductor gap-fill layer 158L is formed that fills a remaining portion of the second trench TR2. The semiconductor gap-fill layer 158L covers the semiconductor liner pattern 155 and the second insulating layer 153L. The semiconductor gap-fill layer 158L is formed of or includes poly silicon.

Figure 9:
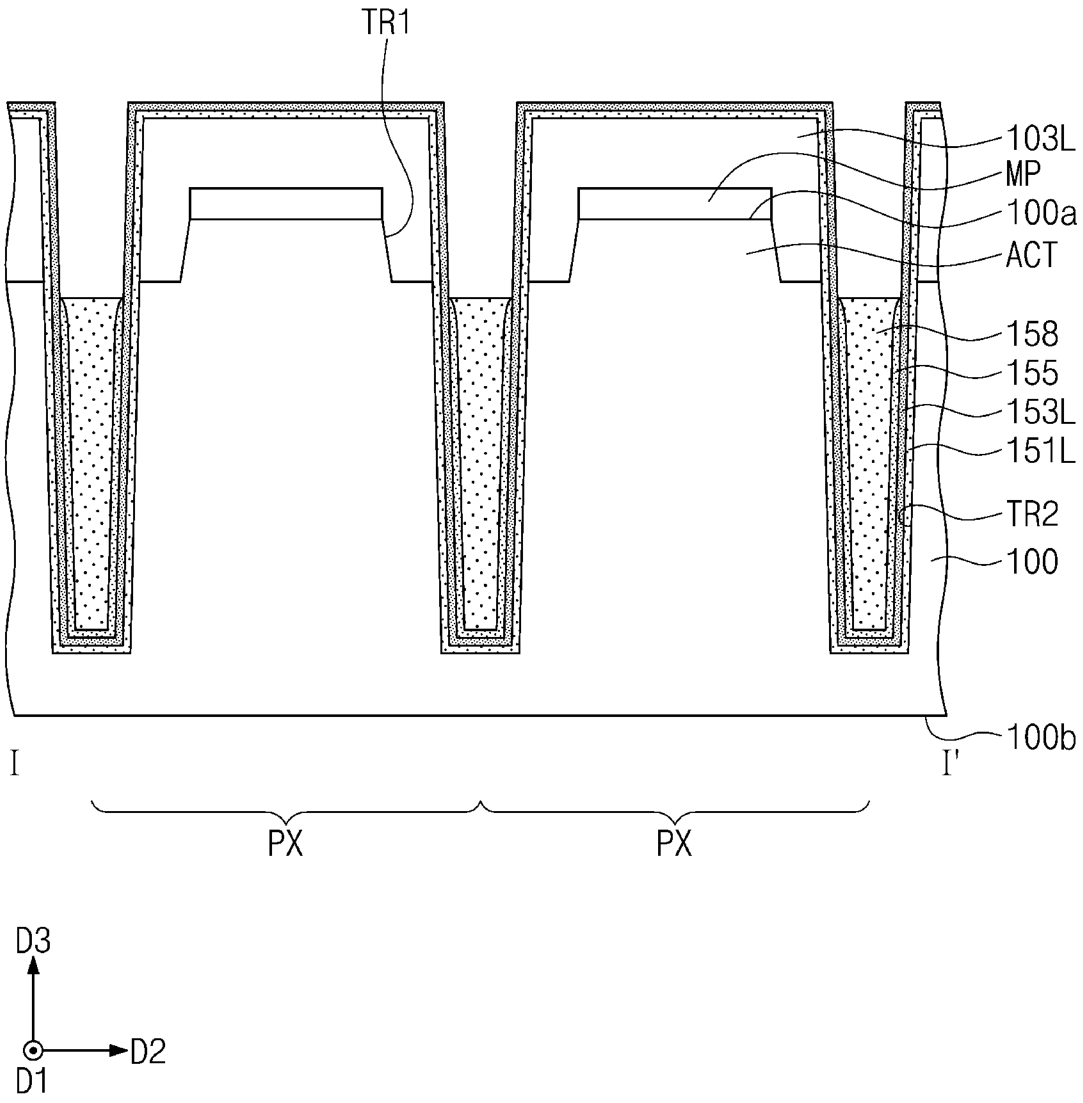

Referring to FIGS. 3 and 9, in an embodiment, an etch-back process is performed on the semiconductor gap-fill layer 158L that forms the semiconductor gap-fill pattern 158. The etch-back process removes an upper portion of the semiconductor gap-fill layer 158L and leaves the semiconductor gap-fill pattern 158 in a lower region of the second trench TR2. In an embodiment, the etch-back process is performed until the top surface of the semiconductor gap-fill pattern 158 is coplanar with the uppermost surface of the semiconductor liner pattern 155.

Figure 10:
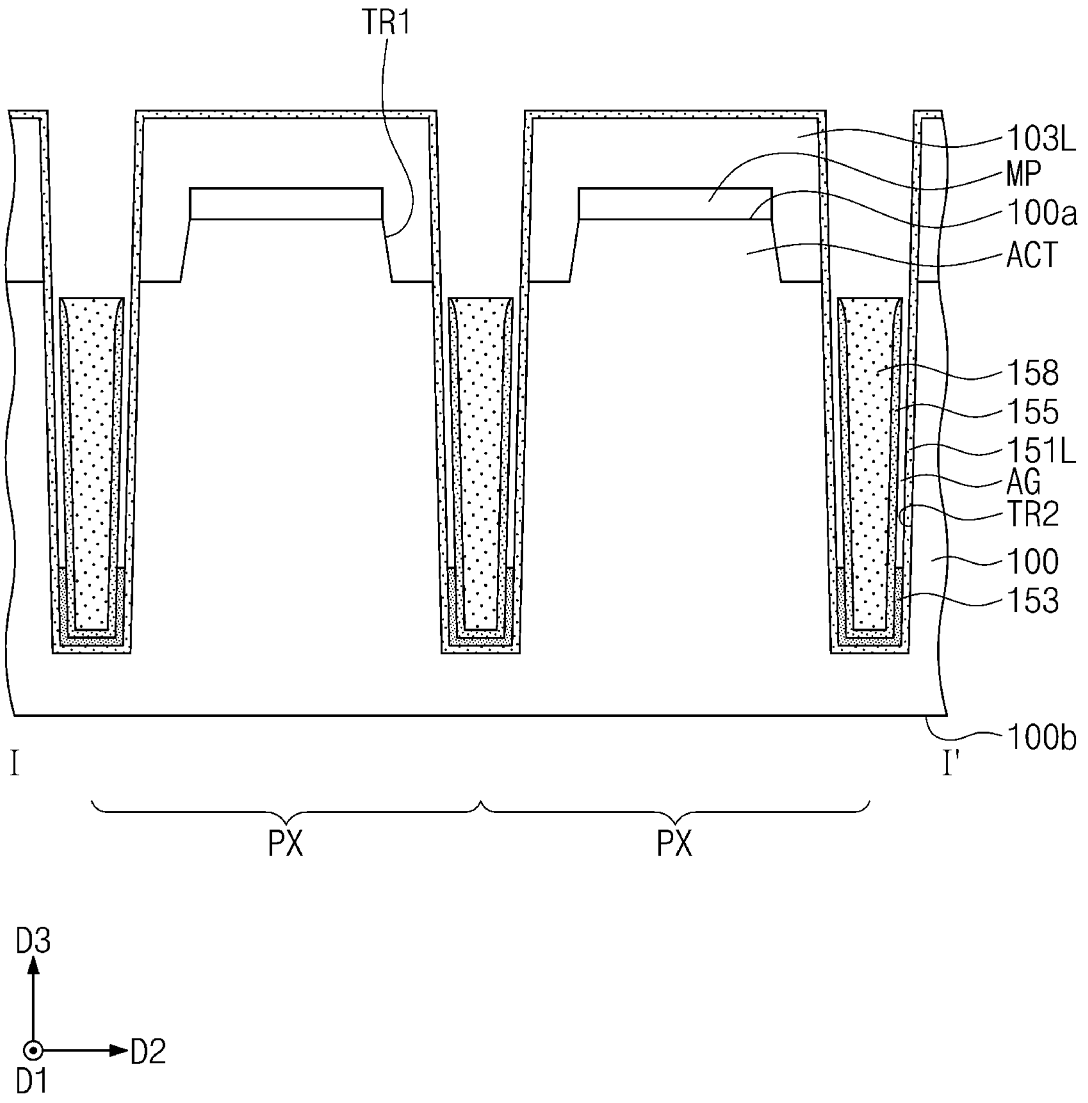

Referring to FIGS. 3 and 10, in an embodiment, an etching process is performed that forms the lower insulating pattern 153. The formation of the lower insulating pattern 153 includes etching a portion of the second insulating layer 153L. The etching process removes an exposed portion of the second insulating layer 153L that is located above the top surface of the semiconductor gap-fill pattern 158, and a portion of the second insulating layer 153L that is interposed between the first insulating layer 151L and the semiconductor liner pattern 155. The etching process is a wet etching process that is performed using an etchant that has an etch selectivity with respect to the second insulating layer 153L as compared with the first insulating layer 151L and/or the semiconductor liner pattern 155. By appropriately adjusting a process time of the wet etching process and/or a concentration of the etchant, a height of the lower insulating pattern 153 can be controlled while preventing the second insulating layer 153L from being fully removed. Accordingly, the air gap region AG, which is a space between the first insulating layer 151L and the semiconductor liner pattern 155, is formed.

Figure 11:
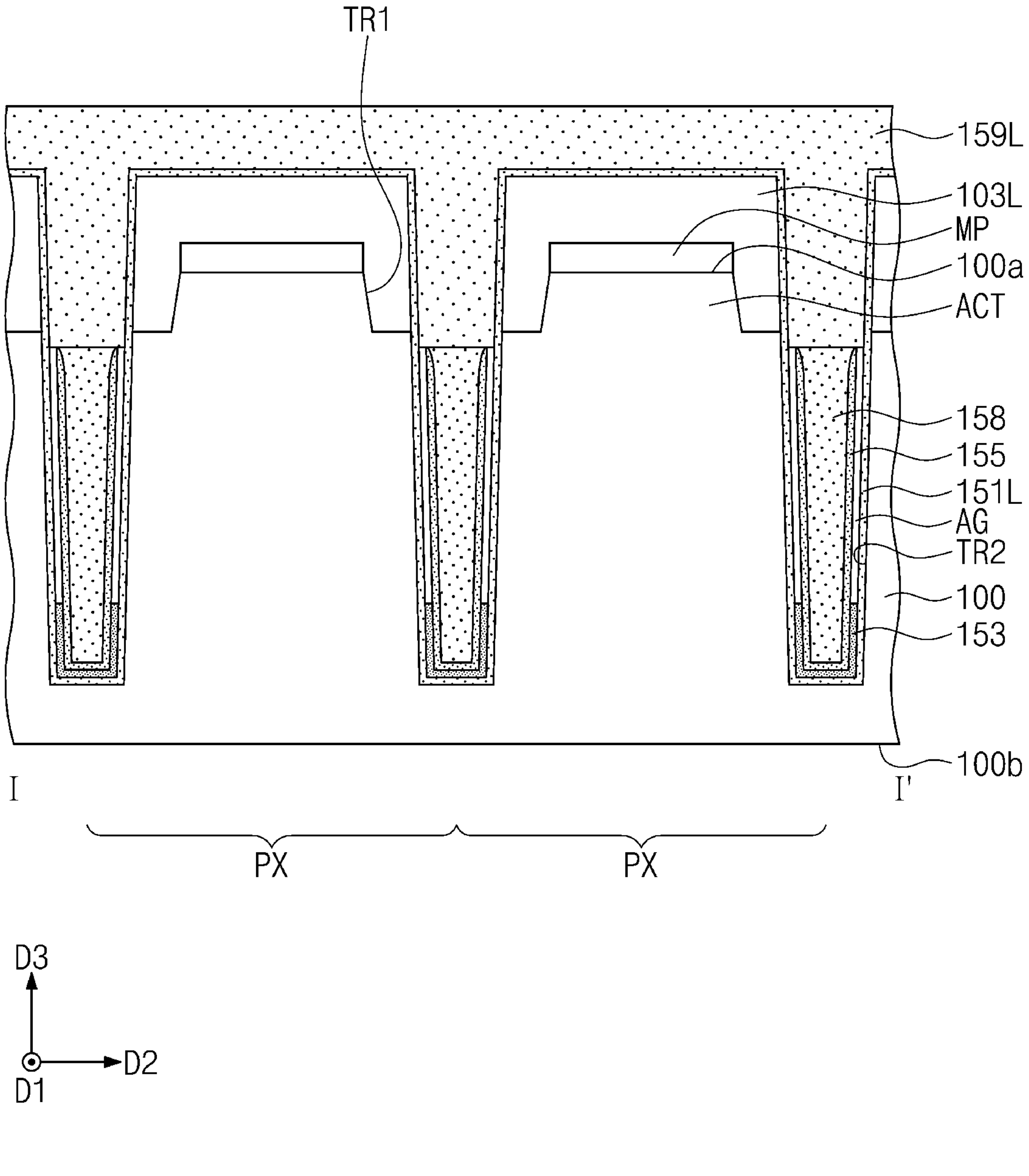

Referring to FIGS. 3 and 11, in an embodiment, a capping insulating layer 159L is formed that fills a remaining portion of the second trench TR2, except for the air gap region AG. The capping insulating layer 159L covers the semiconductor liner pattern 155, the semiconductor gap-fill pattern 158, and the exposed first insulating layer 151L. The capping insulating layer 159L is formed on the air gap region AG but does not fill an inner portion of the air gap region AG. For example, the capping insulating layer 159L does not extend into the air gap region AG. Accordingly, the air gap region AG is enclosed by the first insulating layer 151L, the lower insulating pattern 153, the semiconductor liner pattern 155, and the capping insulating layer 159L.

Referring back to FIGS. 3 and 4, in an embodiment, the capping insulating layer 159L, the first insulating layer 151L, and the device isolation layer 103L are planarized until the first surface 100*a* of the substrate 100 is exposed. The first mask pattern MP may be removed by the planarization process. As a result of the planarization of the capping insulating layer 159L, the first insulating layer 151L, and the device isolation layer 103L, the capping insulating pattern 159, the insulating liner pattern 151, and the shallow isolation pattern 103 are respectively formed. Accordingly, the deep isolation pattern 150 is formed.

The photoelectric conversion region PD is formed in each of the pixel regions PX. In an embodiment, the formation of the photoelectric conversion region PD includes injecting second conductivity type, such as n-type, impurities, that differ from the first conductivity type, such as p-type, into the substrate 100.

The transistors TX, RX, SX, and DX are formed on the first surface 100*a* of the substrate 100 and on each of the pixel regions PX. In an embodiment, the formation of the transfer transistor TX includes doping a corresponding active region ACT with impurities that form the floating diffusion region FD and forming the transfer gate TG on the corresponding active region ACT. The formation of the drive transistor DX, the selection transistor SX, and the reset transistor RX includes doping corresponding active regions ACT with impurities that form impurity regions and forming the drive gate SFG, the selection gate SG, and the reset gate RG on the corresponding respective active regions ACT.

The interconnection layer 20 is formed on the first surface 100*a* of the substrate 100. For example, the first interlayer insulating layer 210 is formed on the first surface 100*a* of the substrate 100 to cover the transistors TX, RX, SX, and DX. The contact plugs BCP are formed in the first interlayer insulating layer 210 and are connected to terminals of the transistors TX, RX, SX, and DX. The second interlayer insulating layer 220 and the third interlayer insulating layer 230 are sequentially formed on the first interlayer insulating layer 210. The first interconnection patterns 222 and the second interconnection patterns 232 are respectively formed in the second interlayer insulating layer 220 and the third interlayer insulating layer 230. The first and second interconnection patterns 222 and 232 are electrically connected to the transistors TX, RX, SX, and DX through the contact plugs BCP.

A thinning process is performed on the second surface 100*b* of the substrate 100. The substrate 100 and the deep isolation pattern 150 are partially removed by the thinning process. For example, a lower portion of the deep isolation pattern 150 is removed by the thinning process, and as a result, the bottom surface of the deep isolation pattern 150 is substantially coplanar with the second surface 100*b* of the substrate 100. The photoelectric conversion layer 10 is formed by the afore-described fabrication process.

The optically-transparent layer 30 is formed on the second surface 100*b* of the substrate 100. For example, the anti-reflection layer 310 and the first passivation layer 312 are sequentially formed on the second surface 100*b* of the substrate 100. The grid pattern 315 is formed on the first passivation layer 312 and vertically overlaps the deep isolation pattern 150. In an embodiment, the formation of the grid pattern 315 includes depositing a metal layer on the first passivation layer 312 and patterning the metal layer. The color filters CF are formed on the first passivation layer 312 and cover the grid patterns 315. The color filters CF are disposed on respective pixel regions PX. The second passivation layer 322 is formed on the color filters CF, and the micro lenses 330 are formed on the second passivation layer 322.

Figure 12:
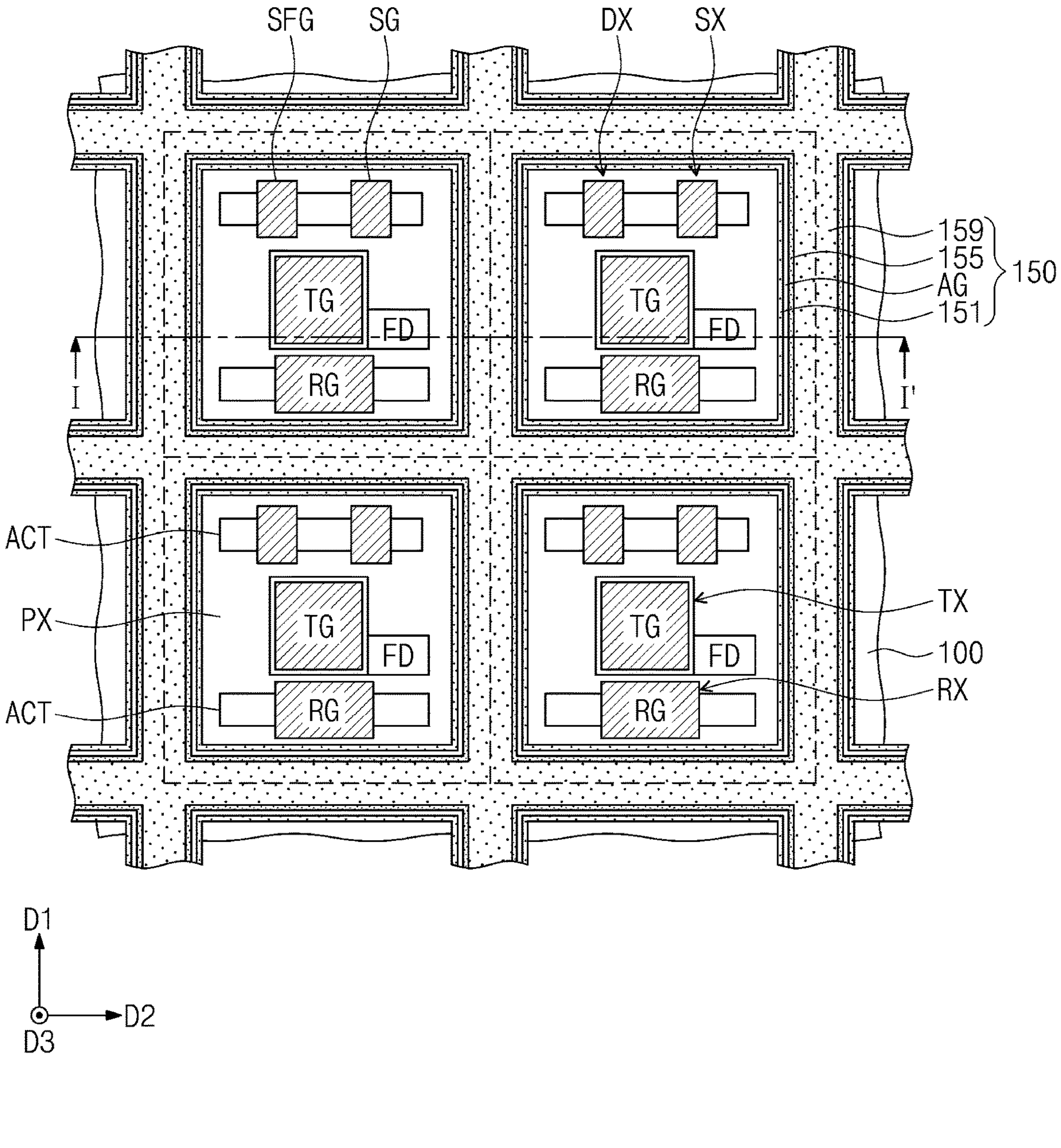
FIG. 12 is a plan view of an image sensor according to an embodiment of the inventive concept.
Figure 13:
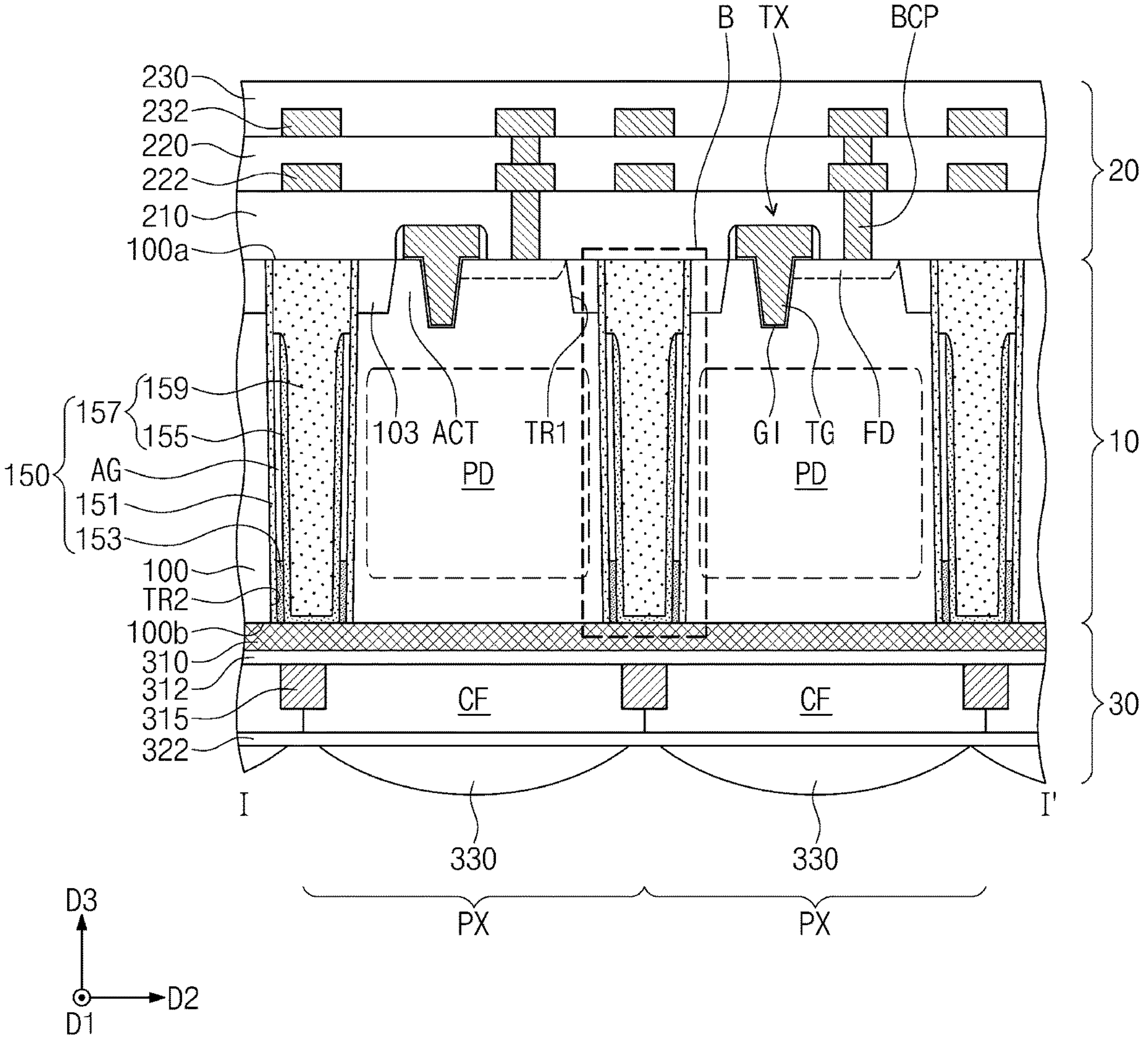
FIG. 13 is a sectional view taken along a line I-I' of FIG. 12 of an image sensor according to an embodiment of the inventive concept.
Figure 14:
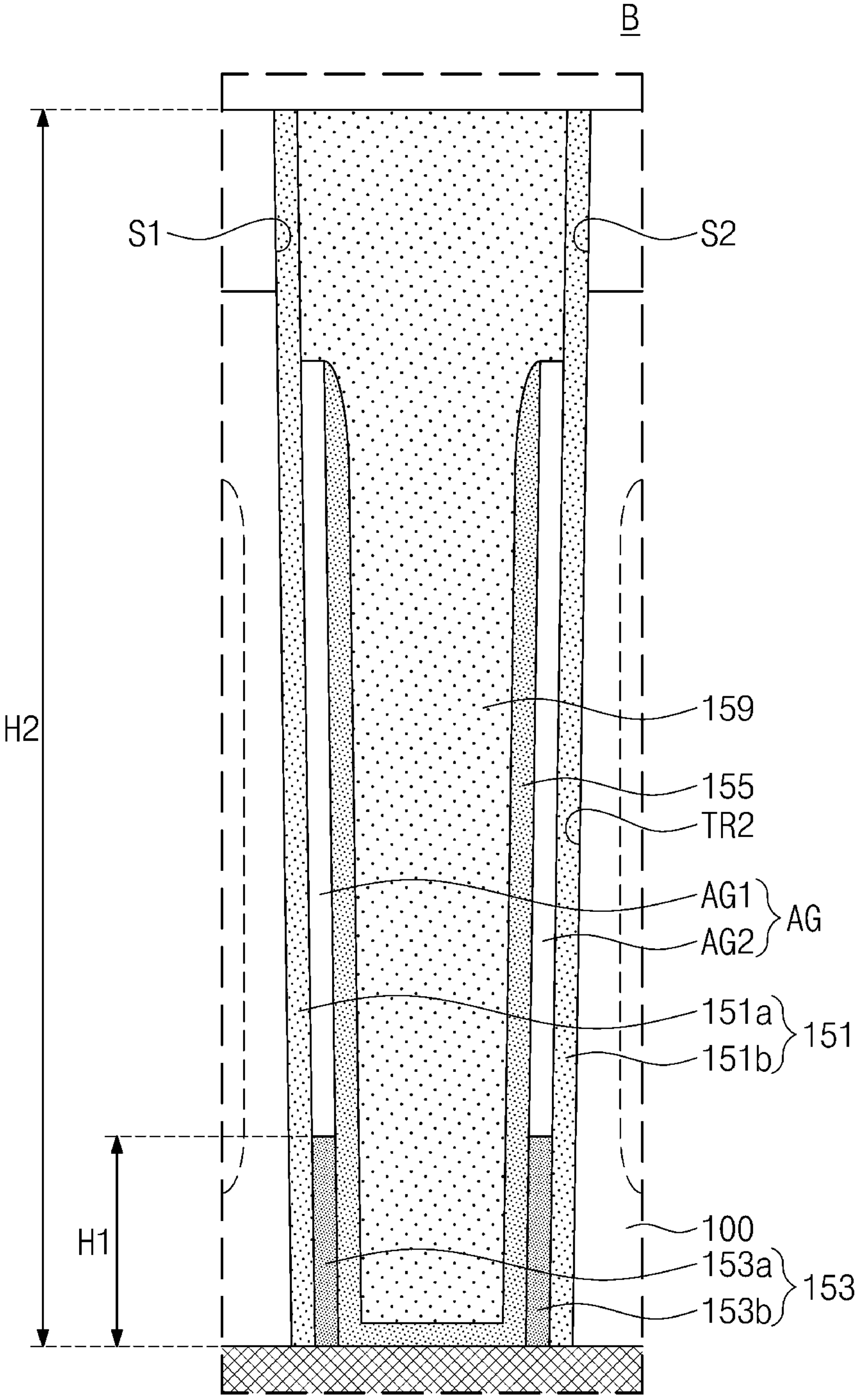
FIG. 14 is an enlarged sectional view of a portion ‘B’ of FIG. 13.

FIG. 12 is a plan view of an image sensor according to an embodiment of the inventive concept. FIG. 13 is a sectional view taken along a line I-I' of FIG. 12 of an image sensor according to an embodiment of the inventive concept. FIG. 14 is an enlarged sectional view of a portion ‘B’ of FIG. 13. For the sake of brevity, image sensor elements previously described with reference to FIGS. 1 to 5 may be identified by the same reference number without a repeated description thereof.

Referring to FIGS. 12, 13, and 14, an image sensor according to an embodiment of the inventive concept includes the photoelectric conversion layer 10, the interconnection layer 20, and the optically-transparent layer 30.

The deep isolation pattern 150 includes the insulating liner pattern 151, the lower insulating pattern 153, and the isolation pattern 157. The deep isolation pattern 150 includes the air gap region AG. In an embodiment, the isolation pattern 157 includes the semiconductor liner pattern 155 and the capping insulating pattern 159.

The capping insulating pattern 159 is disposed on the semiconductor liner pattern 155. The capping insulating pattern 159 fills a remaining portion of the second trench TR2, except for the air gap region AG. The capping insulating pattern 159 covers an inner surface and inner side surfaces of the semiconductor liner pattern 155. The capping insulating pattern 159 covers the upper inner side surface of the first insulating liner pattern 151*a* and the upper inner side surface of the second insulating liner pattern 151*b*. An upper width of the capping insulating pattern 159 is greater than a lower width of the capping insulating pattern 159. The capping insulating pattern 159 is formed of or includes at least one of an oxide material, such as silicon oxide, silicon oxynitride, or a high-k dielectric material, such as hafnium oxide or aluminum oxide.

The first air gap region AG1 is a space that is enclosed by the first insulating liner pattern 151*a*, the first lower insulating pattern 153*a*, and the isolation pattern 157. The first air gap region AG1 is the space between the first insulating liner pattern 151*a* and the semiconductor liner pattern 155 and between the first lower insulating pattern 153*a* and the capping insulating pattern 159. The second air gap region AG2 is a space that is enclosed by the second insulating liner pattern 151*b*, the second lower insulating pattern 153*b*, and the isolation pattern 157. The second air gap region AG2 is the space between the second insulating liner pattern 151*b* and the semiconductor liner pattern 155 and between the second lower insulating pattern 153*b* and the capping insulating pattern 159. In an embodiment, each of the first air gap region AG1 and the second air gap region AG2 contains air.

Figure 15:
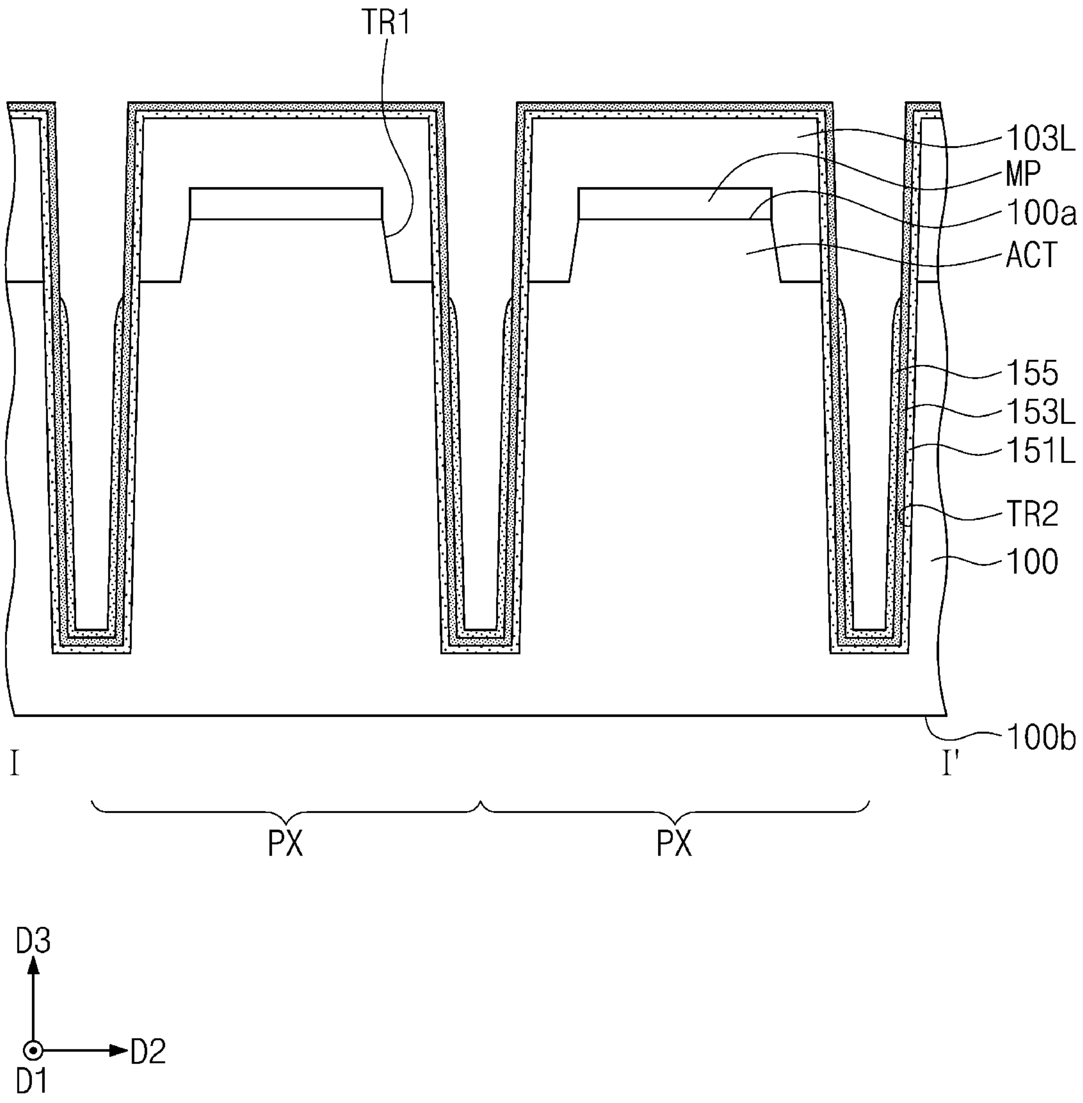
FIGS. 15 to 17 are sectional views that illustrate a method of fabricating an image sensor according to an embodiment of the inventive concept and that correspond to the line I-I' of FIG. 12.
Figure 16:
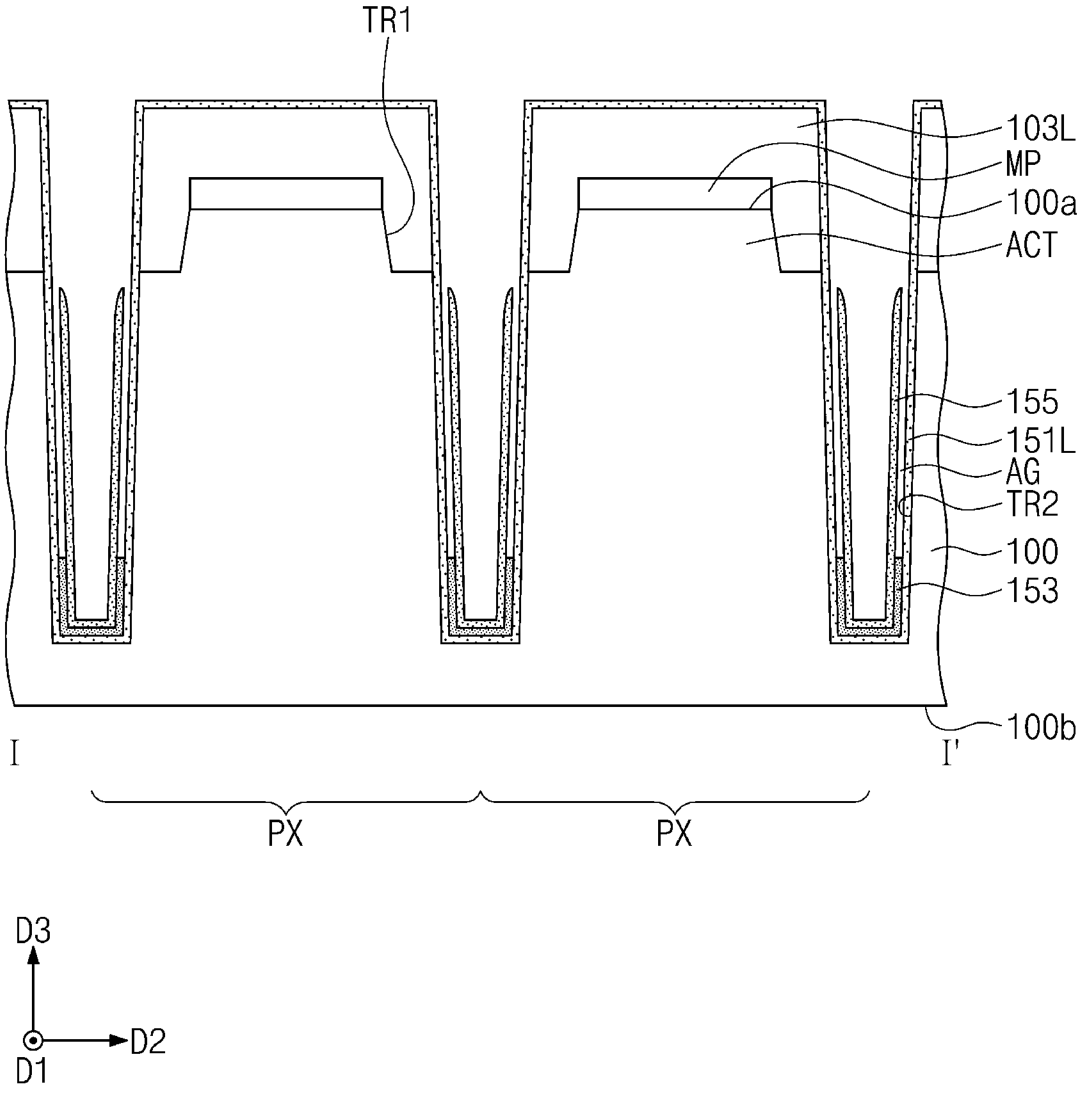
Figure 17:
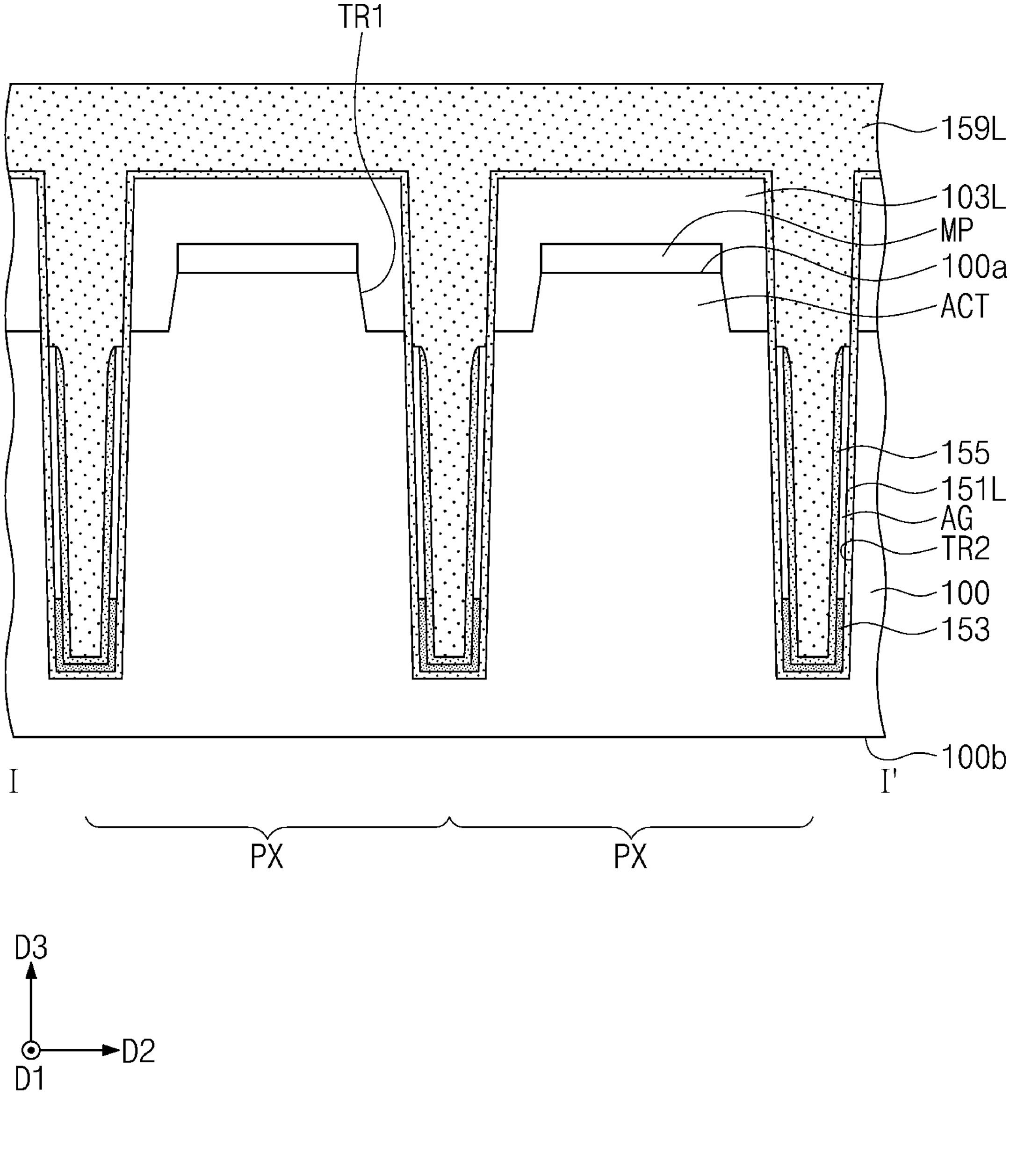

FIGS. 15 to 17 are sectional views that illustrate a method of fabricating an image sensor according to an embodiment of the inventive concept and that correspond to the line I-I' of FIG. 12. For concise description, elements previously described with reference to FIGS. 6-11 may be identified by the same reference number without a repeated description thereof.

Referring to FIGS. 12 and 15, in an embodiment, the first trench TR1 is formed that extends from the first surface 100*a* of the substrate 100 into the substrate 100. The device isolation layer 103L is formed on the first surface 100*a* of the substrate 100. The second trench TR2 is formed in the substrate 100. The first insulating layer 151L is formed that conformally covers the inner side surfaces and the bottom surface of the second trench TR2. The second insulating layer 153L is formed that conformally covers the first insulating layer 151L. The semiconductor liner pattern 155 is formed that conformally covers a portion of second insulating layer 153L and fills a portion of the second trench TR2.

Referring to FIGS. 12 and 16, in an embodiment, an etching process is performed that forms the lower insulating pattern 153. The formation of the lower insulating pattern 153 includes etching a portion of the second insulating layer 153L. A portion of the second insulating layer 153L that is interposed between the first insulating layer 151L and the semiconductor liner pattern 155 is removed by the etching process. The etching process is a wet etching process that is performed using an etchant that has an etch selectivity with respect to the second insulating layer 153L as compared with the first insulating layer 151L and/or the semiconductor liner pattern 155. By appropriately adjusting a process time of the wet etching process and/or a concentration of the etchant, a height of the lower insulating pattern 153 can be controlled while preventing the second insulating layer 153L from being fully removed. Accordingly, the air gap region AG, which is a space between the first insulating layer 151L and the semiconductor liner pattern 155, is formed.

Referring to FIGS. 12 and 17, in an embodiment, the capping insulating layer 159L is formed that fills a remaining portion of the second trench TR2, except for the air gap region AG. The capping insulating layer 159L covers the semiconductor liner pattern 155 and the exposed first insulating layer 151L. The capping insulating layer 159L is formed on the air gap region AG but does not fill an inner portion of the air gap region AG. For example, the capping insulating layer 159L does not extend into the air gap region AG. Accordingly, the air gap region AG is enclosed by the first insulating layer 151L, the lower insulating pattern 153, the semiconductor liner pattern 155, and the capping insulating layer 159L.

Referring back to FIGS. 12 and 13, in an embodiment, a planarization process is performed until the first surface 100*a* of the substrate 100 is exposed. The first mask pattern MP is removed by the planarization process. As a result of the planarization of the capping insulating layer 159L, the first insulating layer 151L, and the device isolation layer 103L, the capping insulating pattern 159, the insulating liner pattern 151, and the shallow isolation pattern 103 are respectively formed. Accordingly, the deep isolation pattern 150 is formed.

The photoelectric conversion region PD is formed in respective pixel regions PX. The transistors TX, RX, SX, and DX are formed on each pixel region PX. The interconnection layer 20 is formed on the first surface 100*a* of the substrate 100. A thinning process is performed on the second surface 100*b* of the substrate 100 that removes a lower portion of the deep isolation pattern 150. The photoelectric conversion layer 10 is formed by the afore-described fabrication process. The optically-transparent layer 30 is formed on the second surface 100*b* of the substrate 100.

Figure 18:
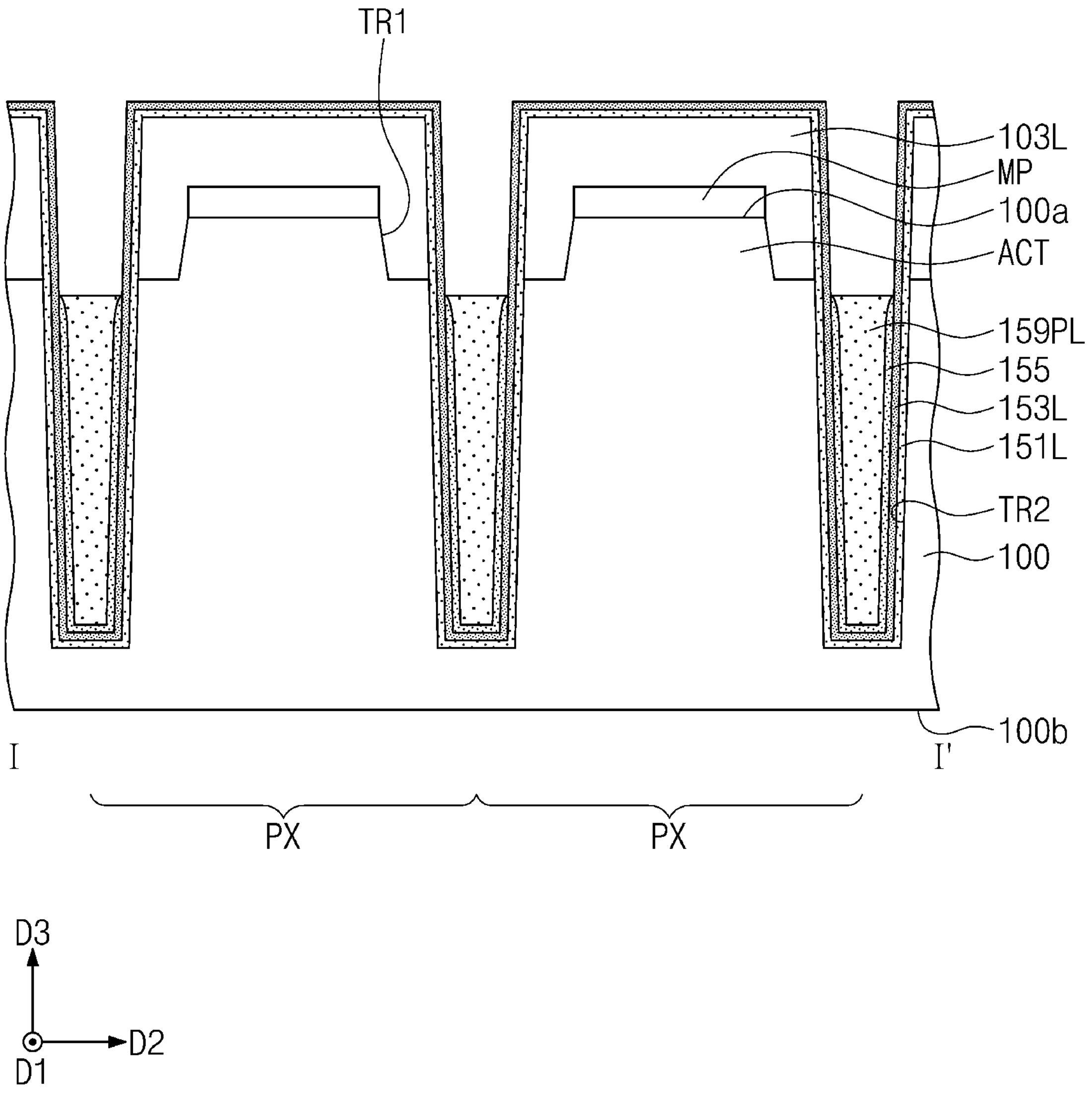
FIGS. 18 to 20 are sectional views that illustrate a method of fabricating an image sensor according to an embodiment of the inventive concept and that correspond to the line I-I' of FIG. 12.
Figure 19:
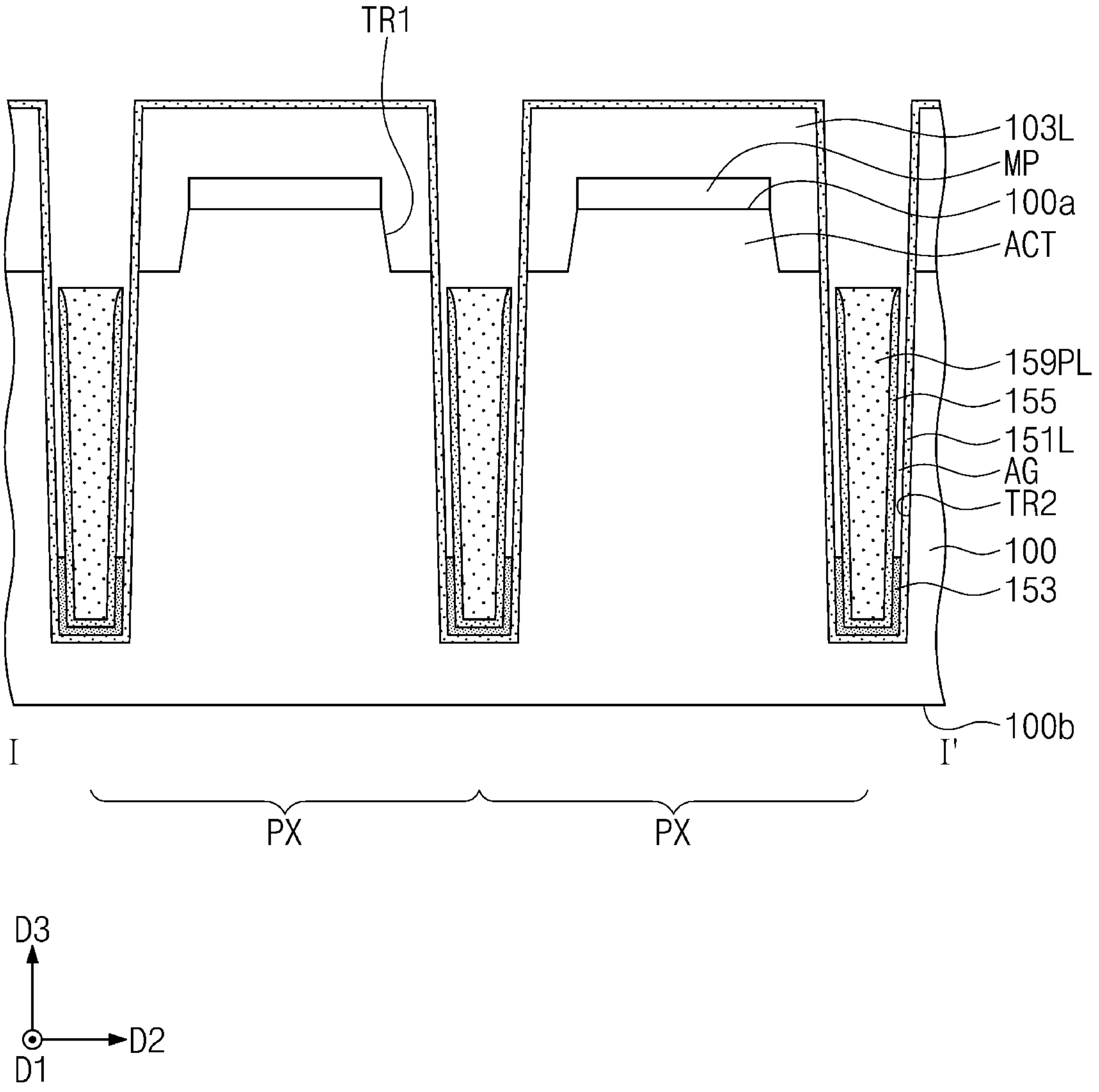
Figure 20:
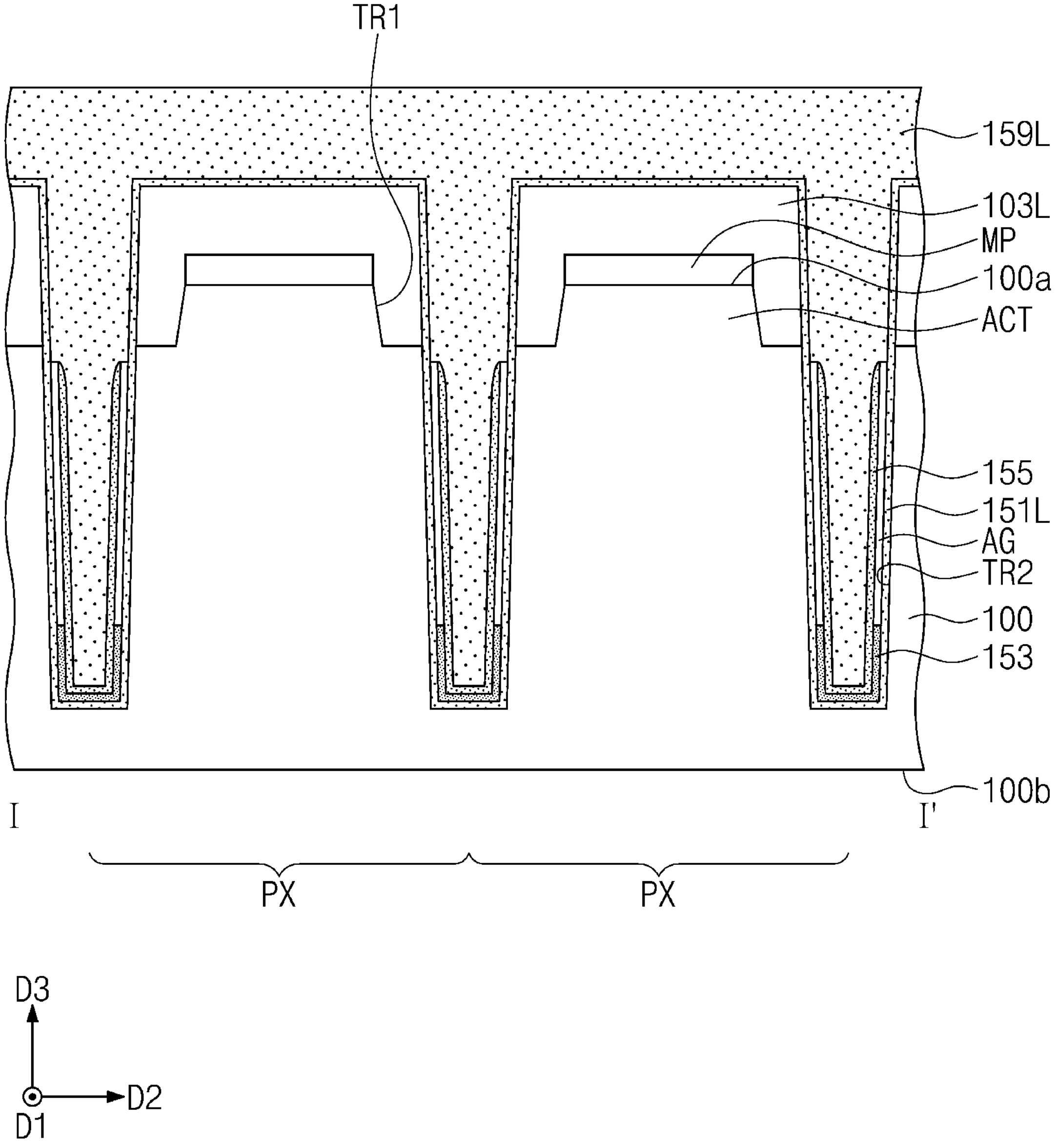

FIGS. 18 to 20 are sectional views that illustrate a method of fabricating an image sensor according to an embodiment of the inventive concept and that correspond to the line I-I' of FIG. 12. For concise description, elements that have been previously described with reference to FIGS. 15-17 may be identified by the same reference number without a repeated description thereof.

Referring to FIGS. 12 and 18, in an embodiment, the first trench TR1 is formed that extends from the first surface 100*a* of the substrate 100 into the substrate 100. The device isolation layer 103L is formed on the first surface 100*a* of the substrate 100. The second trench TR2 is formed in the substrate 100. The first insulating layer 151L is formed that conformally covers the inner side surfaces and the bottom surface of the second trench TR2. The second insulating layer 153L is formed that conformally covers the first insulating layer 151L. The semiconductor liner pattern 155 is formed that conformally covers a portion of the second insulating layer 153L and fills a portion of the second trench TR2.

A preliminary capping insulating layer 159PL is formed in a lower region of the second trench TR2. The formation of the preliminary capping insulating layer 159PL includes forming a semiconductor layer that fills a remaining portion of the second trench TR2 and performing an etch-back process on the semiconductor layer. In an embodiment, the etch-back process is performed until a top surface of the preliminary capping insulating layer 159PL is located at the same level as the uppermost surface of the semiconductor liner pattern 155.

Referring to FIGS. 12 and 19, in an embodiment, the lower insulating pattern 153 is formed by an etching process. The formation of the lower insulating pattern 153 includes etching a portion of the second insulating layer 153L. The etching process removes an exposed portion of the second insulating layer 153L that is located above the top surface of the preliminary capping insulating layer 159PL, and a portion of the second insulating layer 153L that is interposed between the first insulating layer 151L and the semiconductor liner pattern 155. The etching process is a wet etching process that is performed using an etchant that has an etch selectivity with respect to the second insulating layer 153L as compared with the first insulating layer 151L and/or the semiconductor liner pattern 155. By appropriately adjusting a process time of the wet etching process and/or a concentration of the etchant, a height of the lower insulating pattern 153 can be controlled while preventing the second insulating layer 153L from being fully removed. Accordingly, the air gap region AG, which is a space between the first insulating layer 151L and the semiconductor liner pattern 155, is formed.

Referring to FIGS. 12 and 20, in an embodiment, the capping insulating layer 159L is formed by additionally forming an insulating layer on the preliminary capping insulating layer 159PL. The capping insulating layer 159L fills a remaining portion of the second trench TR2, except for the air gap region AG. The capping insulating layer 159L is formed on the air gap region AG but does not fill an inner portion of the air gap region AG. Accordingly, the air gap region AG is enclosed by the first insulating layer 151L, the lower insulating pattern 153, the semiconductor liner pattern 155, and the capping insulating layer 159L.

Referring back to FIGS. 12 and 13, a planarization process is performed that forms the capping insulating pattern 159, the insulating liner pattern 151, and the shallow isolation pattern 103, respectively. Accordingly, the deep isolation pattern 150 is formed. The photoelectric conversion region PD is formed in each of the pixel regions PX. The transistors TX, RX, SX, and DX are formed on each pixel region PX. The interconnection layer 20 is formed on the first surface 100*a* of the substrate 100. A thinning process is performed on the second surface 100*b* of the substrate 100 that removes a lower portion of the deep isolation pattern 150. The photoelectric conversion layer 10 is formed by the afore-described fabrication process. The optically-transparent layer 30 is formed on the second surface 100*b* of the substrate 100.

Figure 21:
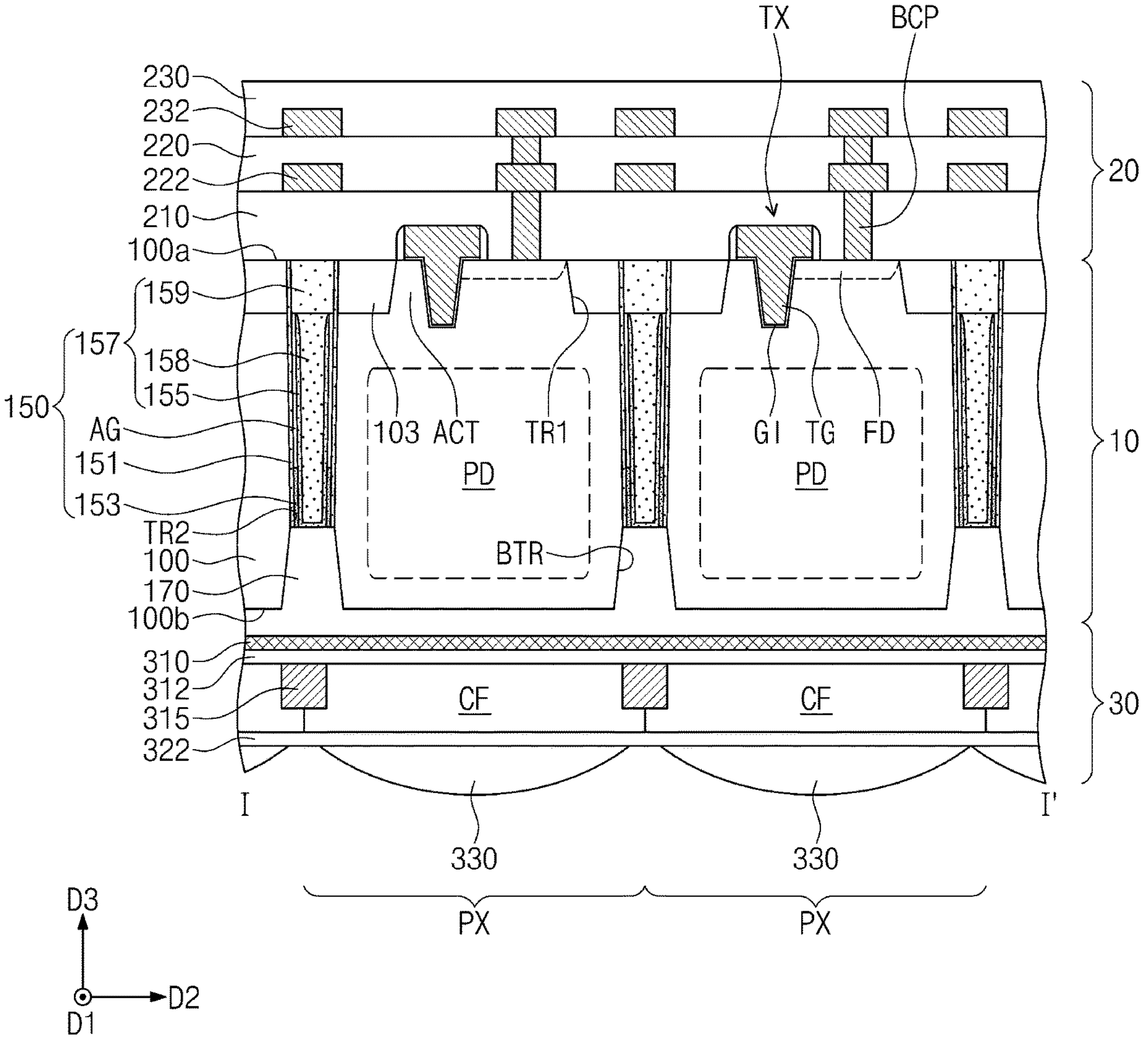
FIG. 21 is a sectional view of an image sensor according to an embodiment of the inventive concept and that corresponds to the line I-I' of FIG. 3.

FIG. 21 is a sectional view of an image sensor according to an embodiment of the inventive concept and that corresponds to the line I-I' of FIG. 3. For the sake of brevity, image sensor elements that were previously described with reference to FIGS. 1 to 4 may be identified by the same reference number without a repeated description thereof.

Referring to FIG. 21, an image sensor according to an embodiment of the inventive concept includes the photoelectric conversion layer 10, the interconnection layer 20, and the optically-transparent layer 30. The deep isolation pattern 150 includes the insulating liner pattern 151, the lower insulating pattern 153, the isolation pattern 157, and the air gap region AG. In an embodiment, the isolation pattern 157 includes the semiconductor liner pattern 155, the semiconductor gap-fill pattern 158, and the capping insulating pattern 159. The bottom surface of the deep isolation pattern 150 is located at a higher level than the second surface 100*b* of the substrate 100.

The photoelectric conversion layer 10 further includes a back-side isolation pattern 170. The back-side isolation pattern 170 extends from the second surface 100*b* of the substrate 100 into the substrate 100. The back-side isolation pattern 170 fills a back-side trench BTR that is recessed from the second surface 100*b* of the substrate 100. The back-side isolation pattern 170 is provided between the pixel regions PX. When viewed in a plan view, the back-side isolation pattern 170 encloses each of the pixel regions PX or has a lattice structure. In an embodiment, the back-side isolation pattern 170 covers the second surface 100*b* of the substrate 100. The deep isolation pattern 150 is in contact with the back-side isolation pattern 170. Accordingly, the deep isolation pattern 150 and the back-side isolation pattern 170 define the pixel regions PX. In an embodiment, the back-side isolation pattern 170 is formed of or includes at least one of a silicon-based insulating material or a metal oxide material.

In an embodiment, the isolation pattern 157 includes the semiconductor liner pattern 155 and the capping insulating pattern 159. The deep isolation pattern 150 is the same as the deep isolation pattern 150 described with reference to FIGS. 12 to 14.

Figure 22:
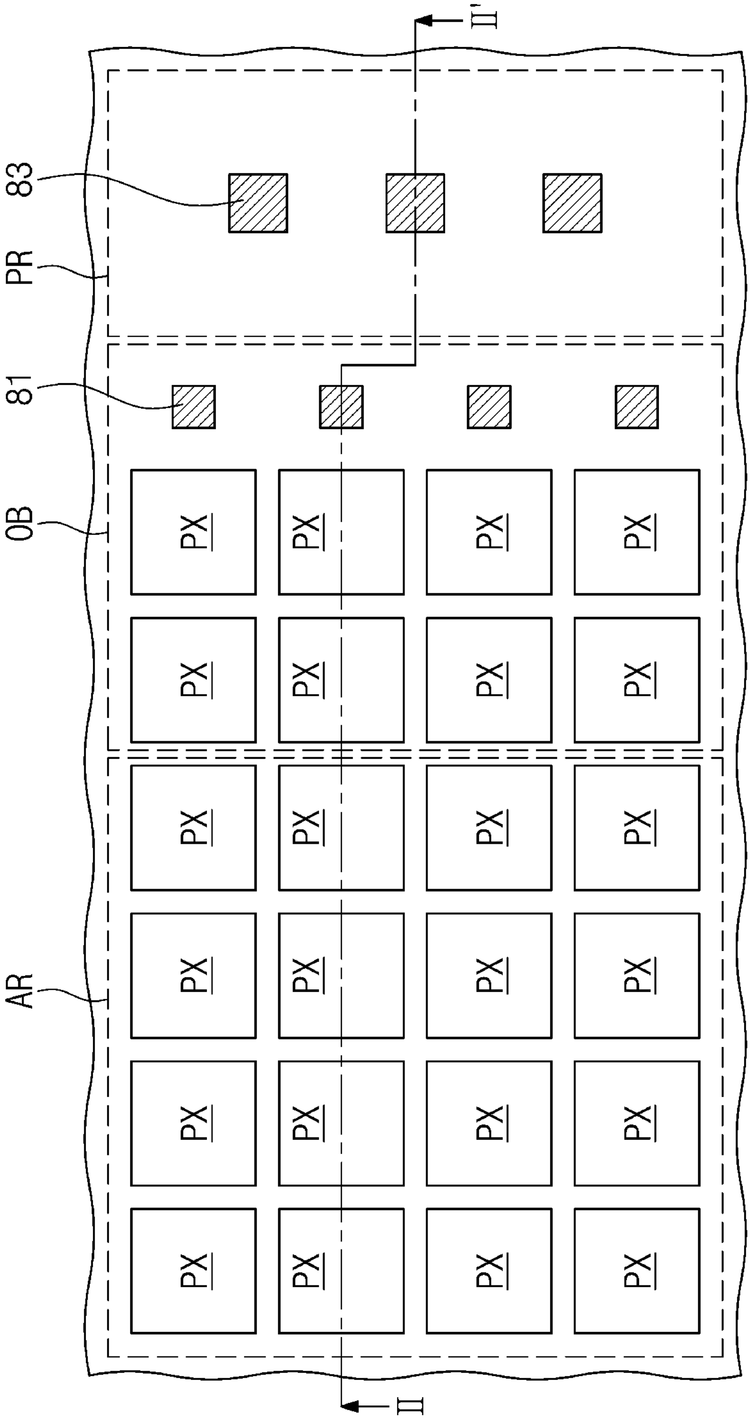
FIG. 22 is a plan view of an image sensor according to an embodiment of the inventive concept.
Figure 23:
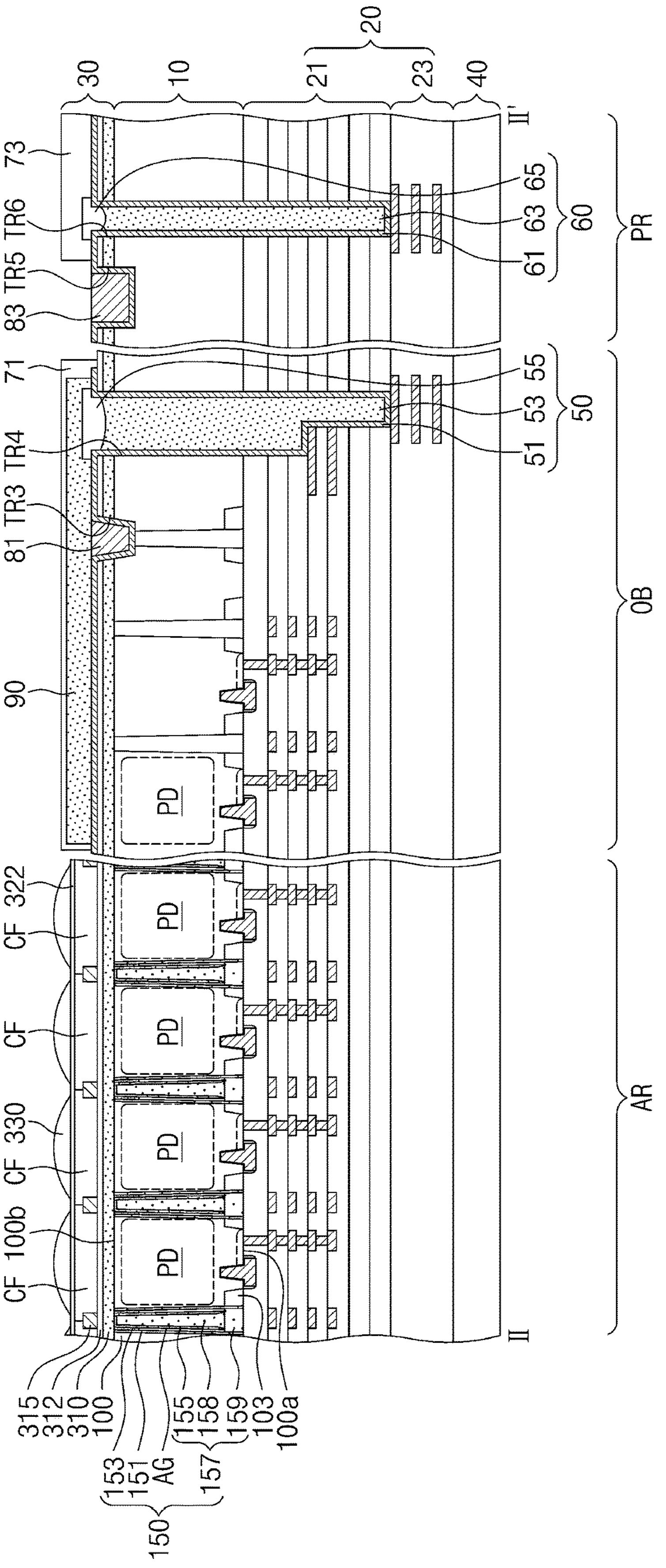
FIG. 23 is a sectional view taken along a line II-II' of FIG. 22 of an image sensor according to an embodiment of the inventive concept.

FIG. 22 is a plan view of an image sensor according to an embodiment of the inventive concept. FIG. 23 is a sectional view taken along a line II-II' of FIG. 22 of an image sensor according to an embodiment of the inventive concept.

Referring to FIGS. 22 and 23, in an embodiment, an image sensor includes the substrate 100 that includes a pixel array region AR, an optical black region OB, and a pad region PR, the interconnection layer 20 on the first surface 100*a* of the substrate 100, a base substrate 40 on the interconnection layer 20, and the optically-transparent layer 30 on the second surface 100*b* of the substrate 100. The interconnection layer 20 is disposed between the first surface 100*a* of the substrate 100 and the base substrate 40. The interconnection layer 20 includes an upper interconnection layer 21 that is provided adjacent to the first surface 100*a* of the substrate 100, and a lower interconnection layer 23 that is provided between the upper interconnection layer 21 and the base substrate 40. The pixel array region AR includes the pixel regions PX and the deep isolation pattern 150 therebetween. The pixel array region is substantially the same as that in an image sensor described with reference to FIGS. 1 to 5. For example, the deep isolation pattern 150 is substantially the same as the deep isolation pattern 150 described with reference to FIGS. 1 to 5. For example, the deep isolation pattern 150 is substantially the same as the deep isolation pattern 150 described with reference to FIGS. 12 to 14.

A first connection structure 50, a first contact 81, and a bulk color filter 90 are disposed on the optical black region OB of the substrate 100. The first connection structure 50 includes a first light-blocking pattern 51, a first isolation pattern 53, and a first capping pattern 55. The first light-blocking pattern 51 is disposed on the second surface 100*b* of the substrate 100. The first light-blocking pattern 51 covers the passivation layer 312 and conformally covers an inner surface of each of third and fourth trenches TR3 and TR4. The first light-blocking pattern 51 penetrates the photoelectric conversion layer 10 and the upper interconnection layer 21. The first light-blocking pattern 51 is connected to the deep isolation pattern 150 of the photoelectric conversion layer 10 and is connected to interconnection lines in the upper and lower interconnection layers 21 and 23. Accordingly, the first connection structure 50 electrically connects the photoelectric conversion layer 10 to the interconnection layer 20. The first light-blocking pattern 51 is formed of or includes at least one metal, such as tungsten. The first light-blocking pattern 51 blocks light that is incident into the optical black region OB.

The first contact 81 fills a remaining portion of the third trench TR3. The first contact 81 is formed of or includes at least one metal, such as aluminum. The first contact 81 is connected to the deep isolation pattern 150. The first isolation pattern 53 fills a remaining portion of the fourth trench TR4. The first isolation pattern 53 penetrates the photoelectric conversion layer 10 and a portion of the upper interconnection layer 21. The first isolation pattern 53 includes an insulating material. The first capping pattern 55 is disposed on the first isolation pattern 53.

The bulk color filter 90 is disposed on the first connection structure 50 and the first contact 81. The bulk color filter 90 covers the first connection structure 50 and the first contact 81. A first protection layer 71 is disposed on the bulk color filter 90 that hermetically seals the bulk color filter 90.

The photoelectric conversion region PD is provided in a corresponding pixel region PX of the optical black region OB. The photoelectric conversion region PD of the optical black region OB is doped to have the second conductivity type, such as n-type, that differs from the first conductivity type of the substrate 100. The photoelectric conversion region PD of the optical black region OB has a similar structure to the photoelectric conversion regions PD of the pixel array region AR but does not generate electrical signals from light, unlike the photoelectric conversion regions PD of the pixel array region AR.

A second connection structure 60, a second contact 83, and a second protection layer 73 are disposed on the pad region PR of the substrate 100. The second connection structure 60 includes a second light-blocking pattern 61, a second isolation pattern 63, and a second capping pattern 65.

The second light-blocking pattern 61 is disposed on the second surface 100*b* of the substrate 100. The second light-blocking pattern 61 covers the passivation layer 312 and conformally covers an inner surface of each of fifth and sixth trenches TR5 and TR6. The second light-blocking pattern 61 penetrates the photoelectric conversion layer 10 and the upper interconnection layer 21. The second light-blocking pattern 61 is connected to the interconnection lines in the lower interconnection layer 23. Accordingly, the second connection structure 60 electrically connects the photoelectric conversion layer 10 to the interconnection layer 20. The second light-blocking pattern 61 is formed of or includes at least one metal, such as tungsten. The second light-blocking pattern 61 blocks light that is incident into the pad region PR.

The second contact 83 fills a remaining portion of the fifth trench TR5. The second contact 83 is formed of or includes at least one metal, such as aluminum. The second contact 83 provides an electric connection path between the image sensor and an external device. The second isolation pattern 63 fills a remaining portion of the sixth trench TR6. The second isolation pattern 63 penetrates the photoelectric conversion layer 10 and a portion of the upper interconnection layer 21. The second isolation pattern 63 is formed of or includes at least one insulating material. The second capping pattern 65 is disposed on the second isolation pattern 63. The second protection layer 73 covers the second connection structure 60.

A current that is applied through the second contact 83 flows to the deep isolation pattern 150 through the second light-blocking pattern 61, the interconnection lines in the interconnection layer 20, and the first light-blocking pattern 51. Electrical signals generated by the photoelectric conversion regions PD in the pixel regions PX of the pixel array region AR are output through the interconnection lines in the interconnection layer 20, the second light-blocking pattern 61, and the second contact 83.

According to an embodiment of the inventive concept, an image sensor includes a deep isolation pattern, and the deep isolation pattern includes an air gap region formed therein and a lower insulating pattern that is adjacent to a surface of a substrate, into which light is incident. Accordingly, due to the air gap region, a loss in optical sensitivity of the image sensor can be minimized. In addition, by adjusting a ratio of the heights of the air gap region and the lower insulating pattern, reflectance of the deep isolation pattern can be controlled, which improves optical properties of the image sensor.

While exemplary embodiments of the inventive concept have been particularly shown and described, it will be understood by one of ordinary skill in the art that variations in form and detail may be made therein without departing from the spirit and scope of the attached claims.

What is claimed is:

1. An image sensor, comprising:

a substrate that includes a trench that defines a plurality of pixel regions; and a deep isolation pattern provided between the pixel regions and in the trench, wherein the deep isolation pattern comprises:

a first insulating liner pattern disposed on a first inner side surface of the trench;

a second insulating liner pattern disposed on a second inner side surface of the trench;

a first lower insulating pattern disposed between the first and second insulating liner patterns and adjacent to the first insulating liner pattern;

a second lower insulating pattern disposed between the first and second insulating liner patterns and adjacent to the second insulating liner pattern;

an isolation pattern provided between the first and second lower insulating patterns and that extends through the substrate;

a first air gap region that is a space enclosed by the first insulating liner pattern, the first lower insulating pattern, and the isolation pattern; and a second air gap region that is a space enclosed by the second insulating liner pattern, the second lower insulating pattern, and the isolation pattern.

2. The image sensor of claim 1, wherein the first lower insulating pattern exposes an upper inner side surface of the first insulating liner pattern, and the second lower insulating pattern exposes an upper inner side surface of the second insulating liner pattern.

3. The image sensor of claim 1, wherein the isolation pattern comprises:

a semiconductor liner pattern that conformally covers a bottom surface of the trench, an inner side surface of the first lower insulating pattern, and an inner side surface of the second lower insulating pattern;

a semiconductor gap-fill pattern that covers inner side surfaces of the semiconductor liner pattern; and a capping insulating pattern disposed on the semiconductor gap-fill pattern and that fills a remaining portion of the trench.

4. The image sensor of claim 3, wherein the semiconductor gap-fill pattern comprises poly silicon, and the semiconductor liner pattern comprises poly silicon doped with p-type impurities.

5. The image sensor of claim 3, wherein the capping insulating pattern comprises a material that differs from that of the semiconductor liner pattern and the semiconductor gap-fill pattern.

6. The image sensor of claim 1, wherein a height of the first lower insulating pattern is between 5% and 20% of a height of the deep isolation pattern, and a height of the second lower insulating pattern is between 5% and 20% of a height of the deep isolation pattern.

7. The image sensor of claim 1, wherein the isolation pattern comprises:

a semiconductor liner pattern that conformally covers a bottom surface of the trench, an inner side surface of the first lower insulating pattern, and an inner side surface of the second lower insulating pattern; and a capping insulating pattern disposed on the semiconductor liner pattern and that fills a remaining portion of the trench.

8. The image sensor of claim 7, wherein an upper width of the capping insulating pattern is greater than a lower width of the capping insulating pattern.

9. The image sensor of claim 7, wherein the semiconductor liner pattern is spaced apart from the first insulating liner pattern by the first lower insulating pattern and the first air gap region, and the semiconductor liner pattern is spaced apart from the second insulating liner pattern by the second lower insulating pattern and the second air gap region.

10. The image sensor of claim 1, wherein the first and second insulating liner patterns comprise a same material, the first and second lower insulating patterns comprise a same material, and the material of the first and second insulating liner patterns differs from the material of the first and second lower insulating patterns.

11. An image sensor, comprising:

a substrate that includes a plurality of pixel regions, wherein the substrate includes a trench that defines the pixel regions; and a deep isolation pattern provided between the pixel regions and in the trench, wherein the deep isolation pattern comprises:

a first insulating liner pattern disposed on a first inner side surface of the trench;

a second insulating liner pattern disposed on a second inner side surface of the trench;

a first lower insulating pattern disposed between the first and second insulating liner patterns and adjacent to the first insulating liner pattern;

a second lower insulating pattern between the first and second insulating liner patterns and adjacent to the second insulating liner pattern;

a semiconductor liner pattern provided between the first and second lower insulating patterns and spaced apart from the first and second insulating liner patterns;

a first air gap region that is a space between the first insulating liner pattern and the semiconductor liner pattern; and a second air gap region that is a space between the second insulating liner pattern and the semiconductor liner pattern.

12. The image sensor of claim 11, wherein a top surface of the first lower insulating pattern is located at a lower level than a top surface of the first insulating liner pattern and an uppermost surface of the semiconductor liner pattern, and a top surface of the second lower insulating pattern is located at a lower level than a top surface of the second insulating liner pattern and the uppermost surface of the semiconductor liner pattern.

13. The image sensor of claim 11, further comprising:

a semiconductor gap-fill pattern that covers inner side surfaces of the semiconductor liner pattern; and a capping insulating pattern disposed on the semiconductor gap-fill pattern and that fills a remaining portion of the trench.

14. The image sensor of claim 13, wherein a top surface of the semiconductor gap-fill pattern is coplanar with an uppermost surface of the semiconductor liner pattern.

15. The image sensor of claim 13, wherein the capping insulating pattern is in contact with the semiconductor liner pattern and the gap-fill pattern.

16. The image sensor of claim 11, further comprising a capping insulating pattern disposed on the semiconductor liner pattern and that fills a remaining portion of the trench.

17. The image sensor of claim 16, wherein the capping insulating pattern comprises an oxide.

18. An image sensor, comprising:

a substrate, wherein the substrate includes a first surface and a second surface that are opposite to each other, a plurality of pixel regions, a first trench that is recessed from the first surface of the substrate, and a second trench that defines the plurality of pixel regions;

a shallow isolation pattern disposed in the first trench;

a deep isolation pattern provided between the pixel regions and in the second trench;

a transistor disposed on the first surface of the substrate;

a micro lens disposed on the second surface of the substrate; and color filters interposed between the substrate and the micro lens and disposed on the pixel regions, respectively, wherein the deep isolation pattern comprises:

a first insulating liner pattern disposed on a first inner side surface of the second trench;

a second insulating liner pattern disposed on a second inner side surface of the second trench;

a first lower insulating pattern disposed between the first and second insulating liner patterns and adjacent to the first insulating liner pattern;

a second lower insulating pattern disposed between the first and second insulating liner patterns and adjacent to the second insulating liner pattern;

a semiconductor liner pattern provided between the first and second lower insulating patterns and spaced apart from the first and second insulating liner patterns;

a first air gap region that is a space between the first insulating liner pattern and the semiconductor liner pattern; and a second air gap region that is a space between the second insulating liner pattern and the semiconductor liner pattern.

19. The image sensor of claim 18, wherein a bottom surface of the deep isolation pattern is coplanar with the second surface of the substrate.

20. The image sensor of claim 18, wherein an upper portion of the semiconductor liner pattern has a width that decreases in a direction toward the first surface of the substrate.

* * * * *